US006538585B2

(12) United States Patent
Liu

(10) Patent No.: US 6,538,585 B2
(45) Date of Patent: Mar. 25, 2003

(54) DISTANCE-ENHANCING CODING METHOD

(75) Inventor: Pi-Hai Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/813,600

(22) Filed: Mar. 20, 2001

(65) Prior Publication Data

US 2002/0063640 A1 May 30, 2002

(30) Foreign Application Priority Data

Oct. 4, 2000 (TW) .......................................... 89120607

(51) Int. Cl.[7] ................................................. H03M 7/00
(52) U.S. Cl. ............................. 341/59; 341/50; 341/60; 341/61; 341/96; 341/102; 341/103; 714/752; 714/802; 375/285; 375/340; 375/341
(58) Field of Search .......................... 341/50, 59, 102, 341/159, 58, 68, 60, 61, 96, 103; 714/752, 802; 375/285, 340, 341

(56) References Cited

U.S. PATENT DOCUMENTS

| 4,486,739 A | * | 12/1984 | Franaszek et al. | ............ 341/59 |
|---|---|---|---|---|
| 6,011,497 A | * | 1/2000 | Tsang et al. | ................... 341/59 |
| 6,084,535 A | * | 7/2000 | Karabed et al. | ............... 341/58 |
| 6,229,458 B1 | * | 5/2001 | Altekar et al. | ................. 341/59 |
| 6,281,815 B1 | * | 8/2001 | Shim et al. | .................... 341/59 |
| 6,285,302 B1 | * | 9/2001 | McClellan | .................... 341/59 |

* cited by examiner

Primary Examiner—Michael Tokar
Assistant Examiner—Linh Van Nguyen
(74) Attorney, Agent, or Firm—W. Wayne Liauh

(57) ABSTRACT

The present invention pertains to a distance-enhancing coding method that can be applied to digital recording and digital communications. It improves the time-varying maximum transition run method used in a conventional distance-enhancing coding to avoid main error events ±(1,−1) from happening. Under the premise of maintaining a code gain of 1.8 dB, the code rate can be increased from ¾ to ⅘. The invention also provides a method of using an enumeration algorithm and an exhaustive method to search for block codes for distance-enhancing coding, which can find required codes by following specific steps.

47 Claims, 10 Drawing Sheets

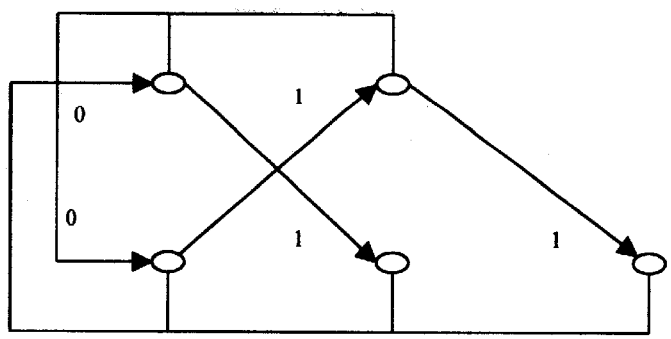
FIG.2A
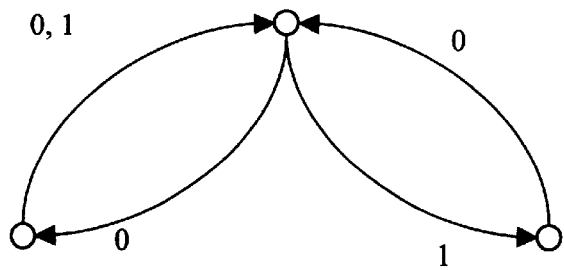
FIG.2B
$$T = \begin{bmatrix} 0 & 2 & 0 \\ 1 & 0 & 1 \\ 0 & 1 & 0 \end{bmatrix}$$
FIG.2C
| Codeword |
|----------|
| 0001 |
| 0010 |
| 0100 |
| 0101 |
| 0110 |
| 1000 |
| 1001 |
| 1010 |
FIG.2D

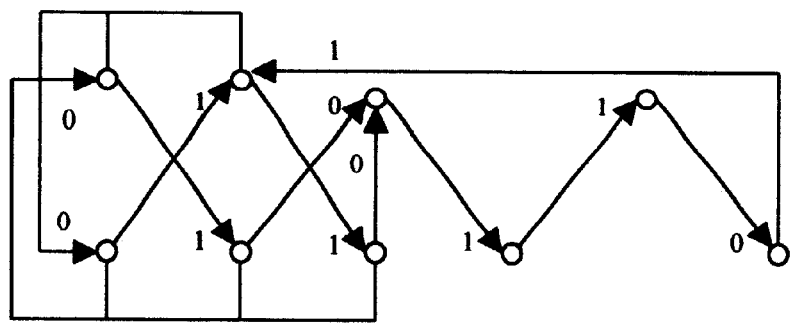
FIG.3A
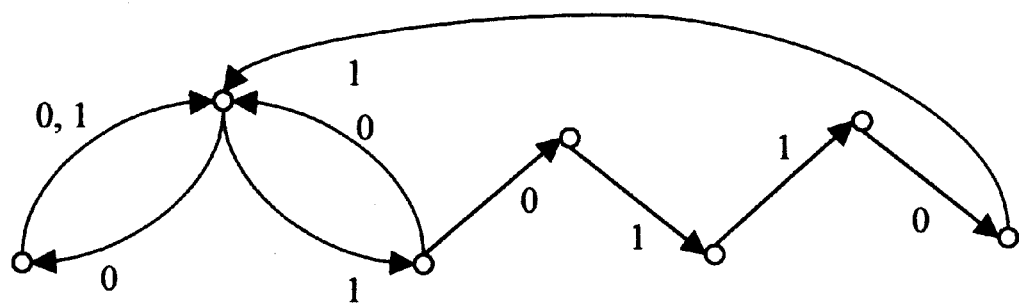
FIG.3B
$$T = \begin{bmatrix} 0 & 2 & 0 & 0 & 0 & 0 & 0 \\ 1 & 0 & 1 & 0 & 0 & 0 & 0 \\ 0 & 1 & 0 & 1 & 0 & 0 & 0 \\ 0 & 0 & 0 & 0 & 1 & 0 & 0 \\ 0 & 0 & 0 & 0 & 0 & 1 & 0 \\ 0 & 0 & 0 & 0 & 0 & 0 & 1 \\ 0 & 1 & 0 & 0 & 0 & 0 & 0 \end{bmatrix}$$
FIG.3C

| | | | | | |
|---|---|---|---|---|---|
| 0000010000 | 0001101000 | 0100010001 | 0101101001 | 1000010010 | 1001101010 |
| 0000010001 | 0001101001 | 0100010010 | 0101101010 | 1000010100 | 1001101101 |
| 0000010010 | 0001101010 | 0100010100 | 0101101101 | 1000010101 | 1010000001 |
| 0000010100 | 0001101101 | 0100010101 | 0110000001 | 1000010110 | 1010000010 |
| 0000010101 | 0010000001 | 0100010110 | 0110000010 | 1000011000 | 1010000100 |
| 0000010110 | 0010000010 | 0100011000 | 0110000100 | 1000011001 | 1010000101 |
| 0000011000 | 0010000100 | 0100011001 | 0110000101 | 1000011010 | 1010000110 |
| 0000011001 | 0010000101 | 0100011010 | 0110000110 | 1000100000 | 1010001000 |
| 0000011010 | 0010000110 | 0100100000 | 0110001000 | 1000100001 | 1010001001 |
| 0000100000 | 0010001000 | 0100100001 | 0110001001 | 1000100010 | 1010001010 |
| 0000100001 | 0010001001 | 0100100010 | 0110001010 | 1000100100 | 1010010000 |
| 0000100010 | 0010001010 | 0100100100 | 0110010000 | 1000100101 | 1010010001 |
| 0000100100 | 0010010000 | 0100100101 | 0110010001 | 1000100110 | 1010010010 |
| 0000100101 | 0010010001 | 0100100110 | 0110010010 | 1000101000 | 1010010100 |
| 0000100110 | 0010010010 | 0100101000 | 0110010100 | 1000101001 | 1010010101 |
| 0000101000 | 0010010100 | 0100101001 | 0110010101 | 1000101010 | 1010010110 |
| 0000101001 | 0010010101 | 0100101010 | 0110010110 | 1000101101 | 1010011000 |
| 0000101010 | 0010010110 | 0100101101 | 0110011000 | 1001000000 | 1010011001 |
| 0000101101 | 0010011000 | 0101000000 | 0110011001 | 1001000001 | 1010011010 |
| 0001000000 | 0010011001 | 0101000001 | 0110011010 | 1001000010 | 1010100000 |
| 0001000001 | 0010011010 | 0101000010 | 0110100000 | 1001000100 | 1010100001 |
| 0001000010 | 0010100000 | 0101000100 | 0110100001 | 1001000101 | 1010100010 |
| 0001000100 | 0010100001 | 0101000101 | 0110100010 | 1001000110 | 1010100100 |
| 0001000101 | 0010100010 | 0101000110 | 0110100100 | 1001001000 | 1010100101 |
| 0001000110 | 0010100100 | 0101001000 | 0110100101 | 1001001001 | 1010100110 |
| 0001001000 | 0010100101 | 0101001001 | 0110100110 | 1001001010 | 1010101000 |
| 0001001001 | 0010100110 | 0101001010 | 0110101000 | 1001010000 | 1010101001 |
| 0001001010 | 0010101000 | 0101010000 | 0110101001 | 1001010001 | 1010101010 |
| 0001010000 | 0010101001 | 0101010001 | 0110101010 | 1001010010 | 1010101101 |
| 0001010001 | 0010101010 | 0101010010 | 0110101101 | 1001010100 | 1010110100 |
| 0001010010 | 0010101101 | 0101010100 | 0110110100 | 1001010101 | 1010110101 |
| 0001010100 | 0010110100 | 0101010101 | 0110110101 | 1001010110 | 1010110110 |
| 0001010101 | 0010110101 | 0101010110 | 0110110110 | 1001011000 | 1011010000 |
| 0001010110 | 0010110110 | 0101011000 | 1000000001 | 1001011001 | 1011010001 |
| 0001011000 | 0100000001 | 0101011001 | 1000000010 | 1001011010 | 1011010010 |
| 0001011001 | 0100000010 | 0101011010 | 1000000100 | 1001100000 | 1011010100 |
| 0001011010 | 0100000100 | 0101100000 | 1000000101 | 1001100001 | 1011010101 |
| 0001100000 | 0100000101 | 0101100001 | 1000000110 | 1001100010 | 1011010110 |
| 0001100001 | 0100000110 | 0101100010 | 1000001000 | 1001100100 | 1011011000 |
| 0001100010 | 0100001000 | 0101100100 | 1000001001 | 1001100101 | 1011011001 |
| 0001100100 | 0100001001 | 0101100101 | 1000001010 | 1001100110 | 1011011010 |
| 0001100101 | 0100001010 | 0101100110 | 1000010000 | 1001101000 | |
| 0001100110 | 0100010000 | 0101101000 | 1000010001 | 1001101001 | |

FIG.3D

| | | | | | |
|---|---|---|---|---|---|
| 0000000001 | 0010100001 | 1000001001 | 1010101001 | 0011011001 | 0110110110 |
| 0000000010 | 0010100010 | 1000001010 | 1010101010 | 0011011010 | 1000000110 |
| 0000000100 | 0010100100 | 1000010000 | 0000000110 | 0100000110 | 1000001101 |
| 0000000101 | 0010100101 | 1000010001 | 0000001101 | 0100001101 | 1000010110 |
| 0000001000 | 0010101000 | 1000010010 | 0000010110 | 0100010110 | 1000011000 |
| 0000001001 | 0010101001 | 1000010100 | 0000011000 | 0100011000 | 1000011010 |
| 0000001010 | 0010101010 | 1000010101 | 0000011010 | 0100011010 | 1000100110 |
| 0000010000 | 0100000000 | 1000100000 | 0000100110 | 0100100110 | 1000101101 |
| 0000010001 | 0100000001 | 1000100001 | 0000101101 | 0100101101 | 1000110001 |
| 0000010010 | 0100000010 | 1000100010 | 0000110001 | 0100110001 | 1000110100 |
| 0000010100 | 0100000100 | 1000100100 | 0000110100 | 0100110100 | 1000110101 |
| 0000010101 | 0100000101 | 1000100101 | 0000110101 | 0100110101 | 1000110110 |
| 0000100000 | 0100001000 | 1000101000 | 0000110110 | 0100110110 | 1001000110 |
| 0000100001 | 0100001001 | 1000101001 | 0001000110 | 0101000110 | 1001001101 |
| 0000100010 | 0100001010 | 1000101010 | 0001001101 | 0101001101 | 1001010110 |
| 0000100100 | 0100010000 | 1001000000 | 0001010110 | 0101010110 | 1001011000 |
| 0000100101 | 0100010001 | 1001000001 | 0001011000 | 0101011000 | 1001011010 |
| 0000101000 | 0100010010 | 1001000010 | 0001011010 | 0101011010 | 1001100000 |
| 0000101001 | 0100010100 | 1001000100 | 0001100000 | 0101100000 | 1001100010 |
| 0000101010 | 0100010101 | 1001000101 | 0001100010 | 0101100010 | 1001101000 |
| 0001000000 | 0100100000 | 1001001000 | 0001101000 | 0101101000 | 1001101001 |
| 0001000001 | 0100100001 | 1001001001 | 0001101001 | 0101101001 | 1001101010 |
| 0001000010 | 0100100010 | 1001001010 | 0001101010 | 0101101010 | 1001101100 |
| 0001000100 | 0100100100 | 1001010000 | 0001101100 | 0101101100 | 1001101101 |
| 0001000101 | 0100100101 | 1001010001 | 0001101101 | 0101101101 | 1010000110 |
| 0001001000 | 0100101000 | 1001010010 | 0010000110 | 0110000000 | 1010001101 |
| 0001001001 | 0100101001 | 1001010100 | 0010001101 | 0110000010 | 1010010110 |
| 0001001010 | 0100101010 | 1001010101 | 0010010110 | 0110001000 | 1010011000 |
| 0001010000 | 0101000000 | 1010000000 | 0010011000 | 0110001001 | 1010011010 |
| 0001010001 | 0101000001 | 1010000001 | 0010011010 | 0110001010 | 1010100110 |
| 0001010010 | 0101000010 | 1010000010 | 0010100110 | 0110001100 | 1010101101 |
| 0001010100 | 0101000100 | 1010000100 | 0010101101 | 0110001101 | 1010110001 |
| 0001010101 | 0101000101 | 1010000101 | 0010110001 | 0110100000 | 1010110100 |
| 0010000000 | 0101001000 | 1010001000 | 0010110100 | 0110100001 | 1010110101 |
| 0010000001 | 0101001001 | 1010001001 | 0010110101 | 0110100010 | 1010110110 |
| 0010000010 | 0101001010 | 1010001010 | 0010110110 | 0110100100 | 1011000001 |
| 0010000100 | 0101010000 | 1010010000 | 0011000001 | 0110100101 | 1011000100 |
| 0010000101 | 0101010001 | 1010010001 | 0011000100 | 0110100110 | 1011000101 |
| 0010001000 | 0101010010 | 1010010010 | 0011000101 | 0110101000 | 1011000110 |
| 0010001001 | 0101010100 | 1010010100 | 0011000110 | 0110101001 | 1011010000 |
| 0010001010 | 0101010101 | 1010010101 | 0011010000 | 0110101010 | 1011010001 |
| 0010010000 | 1000000000 | 1010100000 | 0011010001 | 0110101101 | 1011010010 |
| 0010010001 | 1000000001 | 1010100001 | 0011010010 | 0110110000 | 1011010100 |
| 0010010010 | 1000000010 | 1010100010 | 0011010100 | 0110110001 | 1011010101 |
| 0010010100 | 1000000100 | 1010100100 | 0011010101 | 0110110010 | 1011010110 |
| 0010010101 | 1000000101 | 1010100101 | 0011010110 | 0110110100 | 1011011000 |
| 0010100000 | 1000001000 | 1010101000 | 0011011000 | 0110110101 | 1011011001 |
| | | | | | 1011011010 |

FIG.5A

| | | | | | |
|---|---|---|---|---|---|
| 0000100000 | 0100000101 | 1000100010 | 0000110100 | 0100100110 | 1000101101 |
| 0000100001 | 0100001000 | 1000100100 | 0000110101 | 0100101101 | 1000110000 |
| 0000100010 | 0100001001 | 1000100101 | 0000110110 | 0100110001 | 1000110001 |
| 0000100100 | 0100001010 | 1000101000 | 0001000110 | 0100110100 | 1000110010 |
| 0000100101 | 0100010000 | 1000101001 | 0001001101 | 0100110101 | 1000110100 |
| 0000101000 | 0100010001 | 1000101010 | 0001010110 | 0100110110 | 1000110101 |
| 0000101001 | 0100010010 | 1001000001 | 0001011000 | 0101000110 | 1000110110 |
| 0000101010 | 0100010100 | 1001000010 | 0001011010 | 0101001101 | 1001000110 |
| 0001000001 | 0100010101 | 1001000100 | 0001101000 | 0101010110 | 1001001101 |
| 0001000010 | 0100100000 | 1001000101 | 0001101001 | 0101011000 | 1001010110 |
| 0001000100 | 0100100001 | 1001001000 | 0001101010 | 0101011010 | 1001011000 |
| 0001000101 | 0100100010 | 1001001001 | 0001101100 | 0101100000 | 1001011010 |
| 0001001000 | 0100100100 | 1001001010 | 0001101101 | 0101100010 | 1001101000 |
| 0001001001 | 0100100101 | 1001010000 | 0010000110 | 0101101000 | 1001101001 |
| 0001001010 | 0100101000 | 1001010001 | 0010001101 | 0101101001 | 1001101010 |
| 0001010000 | 0100101001 | 1001010010 | 0010010110 | 0101101010 | 1001101100 |
| 0001010001 | 0100101010 | 1001010100 | 0010011000 | 0101101100 | 1001101101 |
| 0001010010 | 0101000001 | 1001010101 | 0010011010 | 0101101101 | 1010000110 |
| 0001010100 | 0101000010 | 1010000001 | 0010100110 | 0110001000 | 1010001101 |
| 0001010101 | 0101000100 | 1010000010 | 0010101101 | 0110001001 | 1010010110 |
| 0010000001 | 0101000101 | 1010000100 | 0010110001 | 0110001010 | 1010011000 |
| 0010000010 | 0101001000 | 1010000101 | 0010110100 | 0110001100 | 1010011010 |
| 0010000100 | 0101001001 | 1010001000 | 0010110101 | 0110001101 | 1010100110 |
| 0010000101 | 0101001010 | 1010001001 | 0010110110 | 0110100000 | 1010101101 |
| 0010001000 | 0101010000 | 1010001010 | 0011000001 | 0110100001 | 1010110001 |
| 0010001001 | 0101010001 | 1010010000 | 0011000010 | 0110100010 | 1010110100 |
| 0010001010 | 0101010010 | 1010010001 | 0011000100 | 0110100100 | 1010110101 |
| 0010010000 | 0101010100 | 1010010010 | 0011000101 | 0110100101 | 1010110110 |
| 0010010001 | 0101010101 | 1010010100 | 0011000110 | 0110100110 | 1011000001 |
| 0010010010 | 1000000001 | 1010010101 | 0011010000 | 0110101000 | 1011000010 |
| 0010010100 | 1000000010 | 1010100000 | 0011010001 | 0110101001 | 1011000100 |
| 0010010101 | 1000000100 | 1010100001 | 0011010010 | 0110101010 | 1011000101 |
| 0010100000 | 1000000101 | 1010100010 | 0011010100 | 0110101101 | 1011000110 |
| 0010100001 | 1000001000 | 1010100100 | 0011010101 | 0110110000 | 1011010000 |
| 0010100010 | 1000001001 | 1010100101 | 0011010110 | 0110110001 | 1011010001 |
| 0010100100 | 1000001010 | 1010101000 | 0011011000 | 0110110010 | 1011010010 |
| 0010100101 | 1000010000 | 1010101001 | 0011011001 | 0110110100 | 1011010100 |
| 0010101000 | 1000010001 | 1010101010 | 0011011010 | 0110110101 | 1011010101 |
| 0010101001 | 1000010010 | 0000100110 | 0100000110 | 0110110110 | 1011010110 |
| 0010101010 | 1000010100 | 0000101101 | 0100001101 | 1000000110 | 1011011000 |
| 0100000001 | 1000010101 | 0000110000 | 0100010110 | 1000001101 | 1011011001 |
| 0100000010 | 1000100000 | 0000110001 | 0100011000 | 1000010110 | 1011011010 |
| 0100000100 | 1000100001 | 0000110010 | 0100011010 | 1000100110 | |

FIG.5B

DISTANCE-ENHANCING CODING METHOD

BACKGROUND OF THE INVENTION

1. Field of Invention

The present invention relates to a distance-enhancing coding method and, in particular, to a coding method that can be applied in data access on digital recording media and data transmission in digital communications.

2. Related Art

In digital communication systems, digital signals are transmitted from a transmitter to a receiver through a channel. The general interpretation of the channel includes different media. In a communication system, the channel is the medium for transmitting data, such as light, radio waves, etc, to transmit signal to different locations. In a data storage system, the channel is a storage medium, such as a hard disk drive, an optical disk, to store data and to transmit signals to different time points.

The signals at the transmitter are usually encoded by a channel encoder and a modulation code encoder and then modulated by a modulator. Through the transmission of a channel, it is demodulated by a demodulator, decoded by a modulation code decoder and a channel decoder to reach the receiver.

The essential technique in the invention is the design of modulation coding. The way the modulation codes work is to set a few system constraints according to some system requirements. A set of conversion rules is then designed according to the constraints so that the data after converting by these rules can satisfy the constraints of the system. These constraints are often descriptions of the number of consecutive code symbol 1s and the number of consecutive code symbol 0s.

The non-return to zero inversion (NRZI) method is a modulation method that modulates the code symbol 1 in a sequence into a varying potential in signals (the potential variation means changes from the potential 0 to the potential 1 or vice versa), and modulates the code symbol 0 in a sequence into a non-varying potential in signals (the non-varying potential means a potential 1 followed by another potential 1 and a potential 0 followed by another potential 0).

The run length limited (RLL) method is a coding method, which limits the number of consecutive 0s being not smaller than d and not greater than k (i.e., the limits are (d,k)). This method can ensure the normal operation of a phase locked loop (PLL). The smaller the k value is, the better the PLL operates.

The maximum transition run (MTR) method is a coding method that limits the number of consecutive potential variations being not greater than k. Under NRZI modulation, this then limits the number of consecutive code symbol 1s being not greater than k.

The MTR distance gain property is the same as the PLL, but in practice can gain a higher code rate.

The time-varying maximum transition run (TMTR) is a further modification of the MTR, which sets different constraints for the number of consecutive variations depending upon whether it starts at an odd or even position. For example, $(k_{1,odd}, k_{1,even})$TMTR constraints mean that the number of consecutive 1s starting at an odd position is not greater than $k_{1,odd}$ and the number of consecutive 1s starting at an odd position is not greater than $k_{1,even}$. This method can increase the minimum distance of the encoded system to an upper matched filter bound (MFB), therefore, it has the distance enhancing property.

The partial response maximum likelihood (PRML) method is a widely used coding technology in magnetic recording systems to obtain the largest recording density. This includes such methods as PR4, EPR4, EEPR4, etc.

Magnetic recording systems usually adopt the EEPR4 channel to increase the recording density. The relation between the output y and the input x is $y(n)=x(n)+2x(n-1)-2x(n-3)-x(n-4)$, where $x(n-1)$ means the input x earlier than $x(n)$ by one cycle. The dominated error event is $\pm(1,-1,1)$.

Optical recording systems usually adopt the PR2 and EPR2 channels to increase the recording density. Taking the PR2 as an example, the relation between the output y and the input x is $y(n)=x(n)+2x(n-1)+x(n-2)$ and the dominated error event is $\pm(1,-1)$.

With reference to FIG. 1A, there are 16 cases for the dominated error event $\pm(1,-1)$ to occur in a 5-bit sequence. (The upper sequence is received as the lower sequence or vice versa, both of the error forms are $\pm(1,-1)$.) The sequence in the drawing is modulated in the NRZI method.

With reference to FIG. 1B, to prevent error events from happening, sequences with more than 3 consecutive 1s are excluded. In the 16 cases, aside from the first and the last cases the rest 14 cases have either the upper sequence or the lower sequence left at most, thus such error events will not occur. But the first and the last cases may still occur.

If $(k_{1,odd}=2, k_{1,even}=1)$TMTR constraints are set, all of the 16 cases will have either the upper sequence or the lower sequence left at most, all dominated error events will not occur.

FIG. 2A shows a finite-state transition diagram (FSTD) of the NRZI$(k_{1,odd}=2, k_{1,even}=1)$TMTR constraints. The vertex at the bottom of the diagram represent odd positions and the number of 1s starting at the odd positions can be 1 or 2, satisfying the constraint of $k_{1,odd}=2$. The vertex at the top of the diagram represent even positions and the number of 1s starting at the even positions can be 1 only, satisfying the constraint of $k_{1,even}=1$.

With reference to FIG. 2B, which shows a simplified FSTD with the NRZI $(k_{1,odd}=2, k_{1,even}=1)$TMTR constraints, the states are labeled from left to right as $S_1$, $S_2$, and $S_3$. The state $S_1$ travels through path 1 or path 0 to the state $S_2$. The state travels through path 0 to the state $S_2$ and through path 1 to the state $S_3$. The state $S_3$ travels through path 0 to the state $S_2$.

With reference to FIG. 2C, which shows a transition matrix with the NRZI$(k_{1,odd}=2, k_{1,even}=1)$TMTR constraints. The entry in the ith column and jth row of the transition matrix is the number of paths for traveling from state $S_i$ to state $S_j$. For example, $T_{1,1}=0$ means that the number of paths for traveling from state $S_1$ to state $S_1$ is 0; $T_{1,2}=2$ means that the number of paths for traveling from state $S_1$ to state $S_2$ is 2. The code rate refers to the ratio of the input bits over output bits. If an m-bit input sequence is received and converted to an n-bit codeword, where m and n are positive integers and n>m, then the code rate is m/n. The channel capacity is defined as the upper limit of the code rate, which can be obtained by taking the logarithm of the largest eigenvalue of the transition matrix in the base of 2. The transition matrix T provided in the drawing has a channel capacity C of about 0.7925. Since C>¾, it is possible to design a $(k_{1,odd}=2, k_{1,even}=1)$TMTR constrained code with a code rate of ¾; but C<⅘, it is thus impossible to design a $(k_{1,odd}=2, k_{1,even}=1)$TMTR constrained code with a code rate of ⅘.

With reference to FIG. 2D for 8 sets of codewords with the NRZI($k_{1,odd}$=2, $k_{1,even}$=1)TMTR constraints and a code rate of ¾, this coding method has a coding gain of about 1.8 dB.

SUMMARY OF THE INVENTION

It is a primary object of the invention to improve existing TMTR coding methods and to provide a coding method that can keep a coding gain of 1.8 dB while raising the code rate from ¾ to ⅘.

It is another object of the invention to provide a method for searching block codes of distance-enhancing coding that can find required block codes by following specific steps.

BRIEF DESCRIPTION OF THE DRAWINGS

The present invention will become more fully understood from the detailed description given hereinbelow illustration only, and thus are not limitative of the present invention, and wherein:

FIG. 2A is a finite-state transition diagram (FSTD) of the ($k_{1,odd}$=2, $k_{1,even}$=1)TMTR constraints;

FIG. 2B is a state diagram of the ($k_{1,odd}$=2, $k_{1,even}$=1)TMTR constraints;

FIG. 2C is a transition matrix with the ($k_{1,odd}$=2, $k_{1,even}$=1) TMTR constraints;

FIG. 2D list 8 sets of codewords with the ($k_{1,odd}$=2, $k_{1,even}$=1)TMTR constraints;

FIG. 3A is a FSTD of the ($k_{1,odd}$=2, $k_{1,even}$=1)+$\{101101\}_{even}$TMTR constraints;

FIG. 3B is a state diagram of the ($k_{1,odd}$=2, $k_{1,even}$=1)+$\{101101\}_{even}$TMTR constraints;

FIG. 3C is a transition matrix with the ($k_{1,odd}$=2, $k_{1,even}$=1)+$\{101101\}_{even}$TMTR constraints;

FIG. 3D list 8 sets of codewords with the ($k_{1,odd}$=2, $k_{1,even}$=1)+$\{101101\}_{even}$TMTR constraints;

FIG. 5A shows 283 codewords that are free from the error events ±(1,−1); and

FIG. 5B shows 257 codewords that are free from the error events ±(1,−1) and the parameters ρ=5, λ=4.

DETAILED DESCRIPTION OF THE INVENTION

Figure 1A:
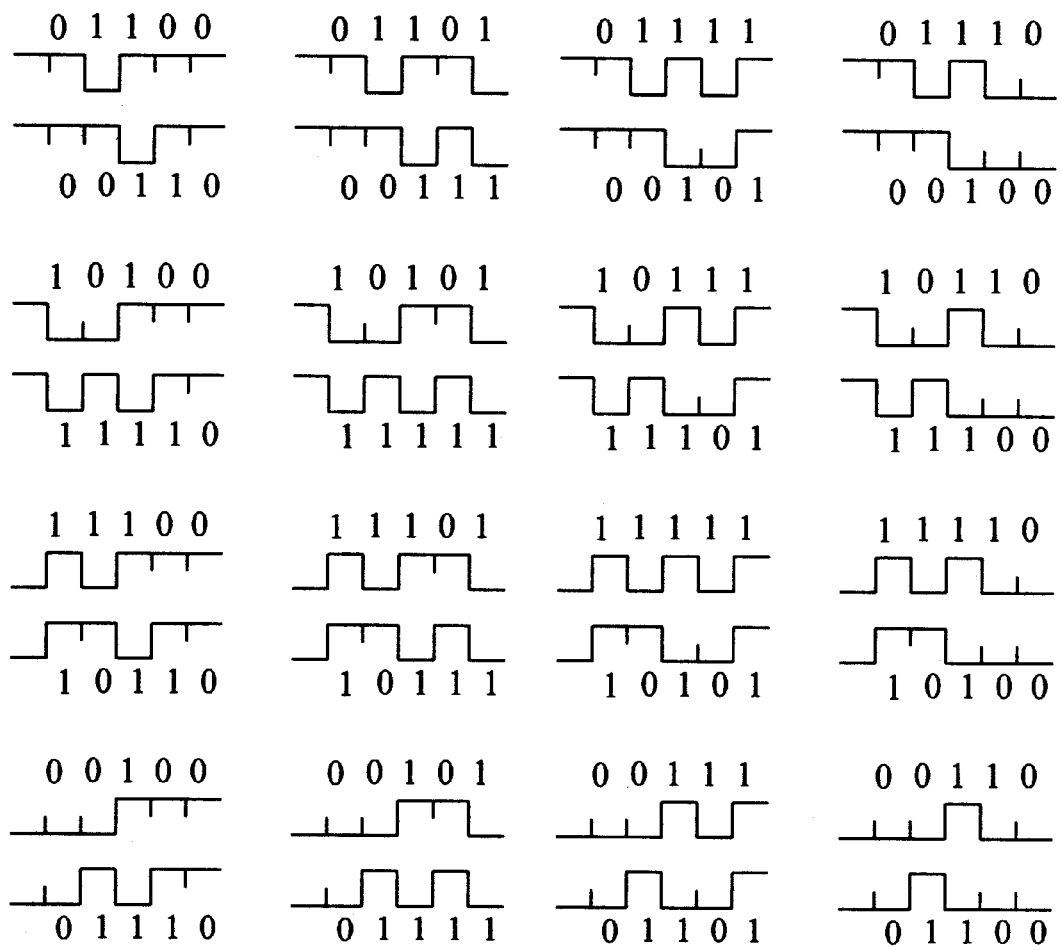
FIG. 1A shows 16 cases for dominated error events to occur to a 5-bit sequence.
Figure 1B:
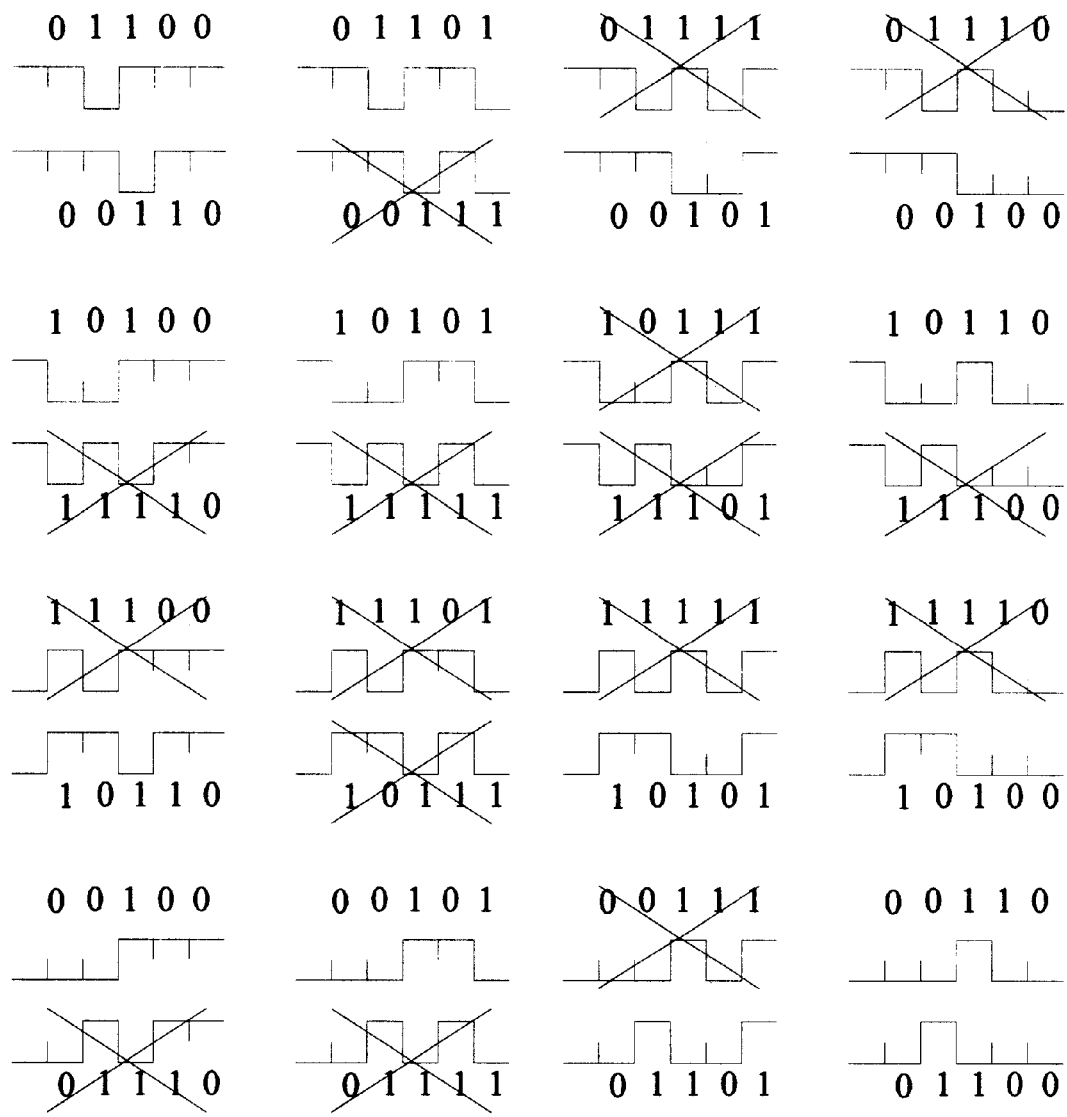
FIG. 1B excludes cases where sequences in FIG. 1A have more than 3 consecutive 1s.

Since the channel capacity of the conventional ($k_{1,odd}$=2, $k_{1,even}$=1)TMTR constraints C ≈0.7925<⅘ and it is thus impossible to design a ($k_{1,odd}$=2, $k_{1,even}$=1)TMTR constrained code with a code rate of ⅘. The present invention proposes several coding methods that keep the coding gain of 1.8 dB while making the channel capacity C>⅘.

The first disclosed method is one that improves the conventional ($k_{1,odd}$=2, $k_{1,even}$=1)TMTR constraints, keeping all code patterns with the conventional ($k_{1,odd}$=2, $k_{1,even}$=1)TMTR constraints while adding extra sequences with '101101' starting at an even position. The code pattern with '101101' starting at an even position may violate the ($k_{1,odd}$=2, $k_{1,even}$=1)TMTR constraints but can exclude dominated error events ±(1,−1).

With reference to FIG. 3A, the vertex at the bottom of the diagram represent odd positions and the number of 1s starting at odd positions can be 1 or 2, satisfying the $k_{1,odd}$=2 constraint. The vertex at the top of the diagram represent even positions and the number of 1s starting at even positions can in principle be 1 only, satisfying the $k_{1,even}$=1 constraint. The exceptions of '101101' starting at even positions are also allowed.

Please refer to FIG. 3B, the state diagram of the simplified NRZI ($k_{1,odd}$=2, $k_{1,even}$=1)+$\{101101\}_{even}$TMTR constraints. This state diagram is converted from FIG. 3A. The states are labeled from left to right as $S_1, S_2, S_3 \ldots S_7$. The state $S_1$ travels through path 1 or 0 to the state $S_2$. The state $S_2$ travels through path 0 to the state $S_1$ and through path 1 to the state $S_3$. The state $S_3$ travels through path 0 to the state $S_2$ or the state $S_4$. The state $S_4$ travels through path 1 to the state $S_5$. The state $S_5$ travels through path 1 to the state $S_6$. The state $S_6$ travels through path 0 to the state $S_7$. The state $S_7$ travels through path 1 to the state $S_2$.

With reference to FIG. 3C, which shows a transition matrix of state diagram shown in FIG. 3B, the transition matrix entry in the ith column and jth row gives the number of paths for traveling from state $S_i$ to state $S_j$. For example, $T_{1,1}$=0 means that the number of paths for traveling from state $S_1$ to state $S_1$ is 0; $T_{1,2}$=2 means that the number of paths for traveling from state $S_1$ to state $S_2$ is 2. One can obtain from the transition matrix the channel capacity C≈0.8170>⅘; it is therefore possible to design a coding method with a code rate of ⅘.

The coding method satisfying the ($k_{1,odd}$=2, $k_{1,even}$=1, $k_0$)+$\{101101\}_{even}$ constraints can be found using the following steps:

$k_0$ is the maximum number of consecutive 0s between two 1s in a sequence. $k_0$ is an important parameter for timing recovery. In coding designs, $k_0$ is selected to be as small as possible. Let λ and ρ represent the maximum number of 0's before the first 1 and after the last 1, respectively. Therefore, $k_0 \leq \lambda + \rho$.

The enumeration algorithm can be employed to count the number of code patterns with a length of n and satisfying the ($k_{1,odd}$=2, $k_{1,even}$=1, $k_0$, λ=∞, ρ) constraints.

We first give the following definitions:

(D.0) Lexicographical order: Two binary sequences of length n are said to be X=(xn, ..., x2, x1)≻Y=(yn, ..., y2, y1)⇔(xp>yp) and (xi=yi)∀p<i≦n. The sequence Y is said to be ordered before the sequence X.

(D.1) An is the lexicographically ordered set of ($k_{1,odd}$=2, $k_{1,even}$=1, $k_0$, λ=∞, ρ) constrained sequences of length n.

(D.2) R(X) is the number of sequences Y∈An such that X≻Y; that is, R(X) is equal to the number of sequences in An that are ordered before X.

(D.3) R(0)=0 where 0 is the all zero sequence.

(D.4) res(X) is the sequence obtained by modifying the first nonzero bit of X to be zero.

(D.5) $U_i$ is the minimum sequence among sequences in An and has the first code symbol 1 at position i.

(D.6) $M_1$ is the maximum sequence among sequences in An and has the first code symbol 1 at position i.

(D.7) Since $w_i = R(U_1) - R(res(U_1))$, we have $$R(\underline{X}) = \sum_{i=0}^{n-1} x_i w_i.$$

(D.8) $t_i = R(M_i)$.

By definitions (D.5) and (D.6), it is easy to see that $R(U_i) = R(M_{i-1}) + 1$.

The $w_i$'s and $t_i$'s can be obtained by the following recursive relation with the initial conditions $w_0 = 1$, $t_0 = 1$.

$$\begin{cases} w_i = t_{i-1} + 1 - R(res(\underline{U}_i)) \\ t_i = R(\underline{M}_i) \end{cases}$$

For illustrative purposes, consider ($k_{1,odd}=2$, $k_{1,even}=1$, $k_0=11$, $\lambda=5$, $\rho=6$) constrained sequences with a length 10, one has

| i → | 10 | 9 | 8 | 7 | 6 | 5 | 4 | 3 | 2 | 1 |
|---|---|---|---|---|---|---|---|---|---|---|
| $w_i$ → | 158 | 79 | 53 | 27 | 18 | 9 | 6 | 3 | 2 | 1 |
| $t_i$ → | 237 | 158 | 79 | 53 | 26 | 17 | 8 | 5 | 2 | 1 |
| $R(res(\underline{U}_i))$ → | 1 | 1 | 1 | 0 | 0 | 0 | 0 | 0 | 0 | 0 | where $\underline{M}_1 = (0000000001)$, $\underline{M}_2 = (0000000010)$, $\underline{M}_3 = (0000000110)$, $\underline{M}_4 = (0000001010)$, $\underline{M}_5 = (0000011010)$, $\underline{M}_6 = (0000101010)$, $\underline{M}_7 = (0001101010)$, $\underline{M}_8 = (0010101010)$, $\underline{M}_9 = (0110101010)$, $\underline{M}_{10} = (1010101010)$, The above example uses a binary sequence to demonstrate, yet one can still apply the above method and its results to other non-binary cases by simply changing the code symbol 1 in the sequence into a nonzero symbol and generalizing a "binary sequence" into a "sequence".

The number of code patterns with a length of 10 satisfying the ($k_{1,odd}=2$, $k_{1,even}=1$, $k_0=11$, $\lambda=5$, $\rho=6$) constraints is equal to $t_{10} - t_4 = 237 - 8 = 229$. The number of code patterns with a length of 10 and having '101101' start at even positions is equal to $(t_4+1) \times 2 + (t_2+1) \times (t_2+1) = 27$. Taking the union of these two sets, one obtains codewords with a length of 10 and satisfying the ($k_{1,odd}=2$, $k_{1,even}=1$, $k_0=11$)+{101101}$_{even}$ constraints. There are $(229+27)=256$ such codewords with a code rate of 8/10 and they can avoid the occurrence of dominated error events $\pm\{1\ -1\}$.

These 256 codewords are tabulated in FIG. 3D. If the parameters $k_0$, $\lambda=6$ and $\rho$ are selected to be greater than the corresponding values given in the previous example, then the number of codewords will be greater than 256. One can then choose any 256 codewords from these codewords to form a codebook. The selecting criteria may be the $k_0$ parameter, the quasi-catastrophic error events, etc.

The above description gives an example of constructing a block code. To design a code which satisfies the target ($k_{1,odd}=2$, $k_{1,even}=1$, $k_0$)+{101101}$_{even}$ constraints, one can take the following steps:

(step 1) Specify a block length of n and a code rate m/n for the code.

(step 2) Set $\rho$ to be the largest integer which is neither greater than $k_0$ nor less than $k_0/2$. Enumerate the binary sequences with a length of i and satisfying the ($k_{1,odd}=2$, $k_{1,even}=1$, $k_0$, $\lambda=\infty$, $\rho$) constraints. The number of such binary sequences is denoted by $t_1$. Set $N_i = w_i t_{i-2}$ for i=1, 2, ..., n.

(step 3) Let $\lambda = k_0 - \rho$. There will be $N_n - t_{n-\lambda-1}$ code patterns satisfying the ($k_{1,odd}=2$, $k_{1,even}=1$, $k_0$) constraints.

(step 4) Enumerate the sequences having a '101101' sequence starting at an even position. The number is equal to $$B_n = \sum_{j=1}^{\lfloor \frac{n}{6} \rfloor} (X_{n,j} - Y_{n,j}),$$

where $$X_{n,j} = \sum_{\substack{(i_1,i_2,i_3,i_j) \geq 0, \\ 2\sum_{l=1}^{j} i_l \leq n-6j}} \left[ \left( N_{n-6j-2\sum_{l=1}^{j} i_l} + 1 \right) \prod_{l=1}^{J} (t_{2i_l} + 1) \right],$$

$$Y_{n,j} = \sum_{\substack{(i_1,i_2,i_3,i_j) \geq 0, \\ 2\sum_{l=1}^{j} i_l \leq n-6j-\lambda-1}} \left[ \left( N_{n-\lambda-1-6j-2\sum_{l=1}^{j} i_l} + 1 \right) \prod_{l=1}^{J} (t_{2i_l} + 1) \right].$$

(step 5) The total number of binary sequences of length n and satisfying the ($k_{1,odd}=2$, $k_{1,even}=1$, $k_0$)+{101101}$_{even}$ constraints is equal to $C_n = B_n + N_n - t_{n-\lambda-1}$.

(step 6) If $C_n$ is less than $2^m$, then increase n, $k_0$, $\rho$ or decrease m, and return to step 1. If $C_n$ is not less than $2^m$, then choose $2^m$ codewords from the $C_n$ codewords to form a code with a code rate of m/n.

Figure 4A:
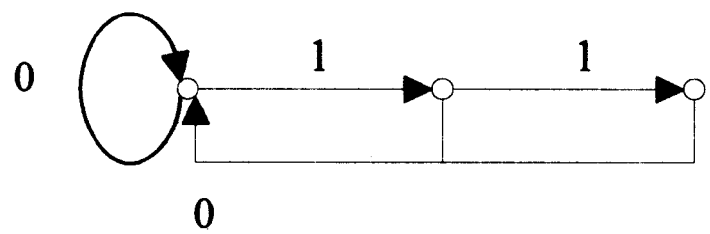
FIG. 4A is a state diagram of the NRZI($k_1$=2)MTR constraints.

With reference to FIG. 4A, $k_1=2$ means that the maximum number of consecutive 1s is 2. That is, sequences with more than 2 consecutive 1s will be removed. The states are labeled from left to right as $S_1$, $S_2$, and $S_3$. The state $S_1$ travels through path 1 to the state $S_2$. The state $S_1$ also travels through path 0 back to the state $S_1$. The state $S_2$ travels through path 1 to the state $S_3$ and through path 0 to the state $S_1$. The state $S_3$ travels through path 0 to the state $S_1$.

Figure 4B:
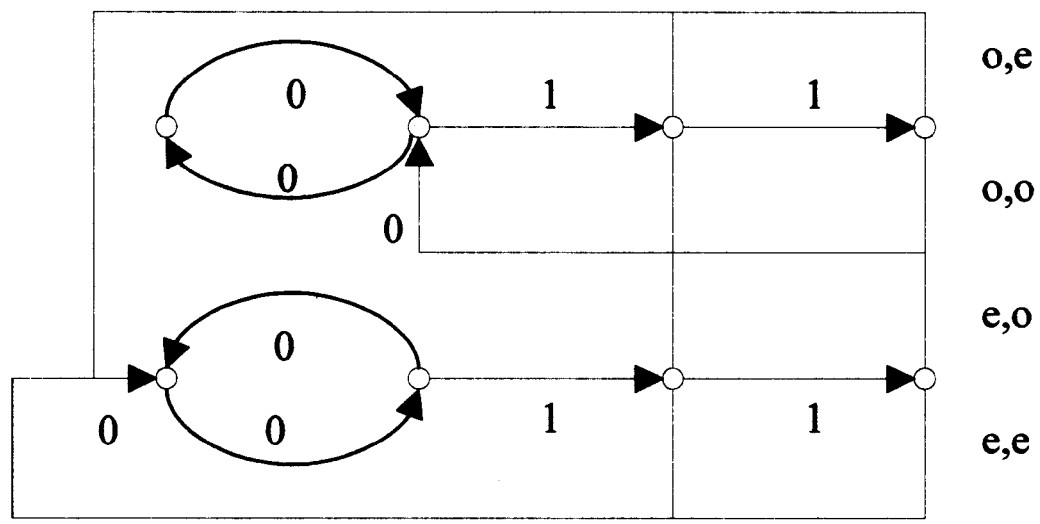
FIG. 4B is another state diagram of the NRZI($k_1$=2)MTR constraints.

FIG. 4B is a state diagram showing four situations distinguished by whether the number of 0s appearing before or after '11' is odd or even under the NRZI ($k_1=2$) MTR constraints.

The index of states in FIG. 4B is expressed by $$\begin{pmatrix} S_1 & S_2 & S_3 & S_4 \\ S_5 & S_6 & S_7 & S_8 \end{pmatrix}.$$

The transition from the state $S_4$ to the state $S_5$ represents a transition with the numbers of 0's before and after '11' are odd and even, respectively. Such sequences form a set with an oe constraint. The transition from the state $S_4$ to the state $S_2$ represents a transition with the numbers of 0's before and after '11' are both odd. Such sequences form a set with an oo constraint. The transition from the state $S_8$ to the state $S_2$ represents a transition with the numbers of 0's before and after '11' are even and odd, respectively. Such sequences form a set with an eo constraint. The transition from the state $S_8$ to the state $S_5$ represents a transition with the numbers of 0's before and after '11' are both even. Such sequences form a set with an ee constraint. These four sets may have a joint set; for example, '1011001001101' simultaneously belongs to the four sets.

The codewords of this method are obtained through the following steps:

(step 1) Let $A$ be the set of sequences with the number of consecutive code symbol 1s less than or equal to $k_1$ and the number of consecutive code symbol 0s less than or equal to $k_0$, where $k_1$ is the minimum integer that will make sequences in $A$ have dominated error events.

(step 2) Suppose the number of the longest consecutive 1s in the sequences in the set $A$ is $k_1$. Let the sequences with an odd number of 0s before the consecutively $k_1$ 1s and an odd number of 0s after the consecutively $k_1$ 1s form an oo-constrained set, the sequences with an odd number of 0s before the consecutively $k_1$ 1s and an even number of 0s after the consecutively $k_1$ 1s form an oe-constrained set, the sequences with an even number of 0s before the consecutively $k_1$ 1s and an odd number of 0s after the consecutively $k_1$ 1s form an eo-constrained set, and the sequences with an even number of 0s before the consecutively $k_1$ 1s and an even number of 0s after the consecutively $k_1$ 1s form an ee-constrained set.

(step 3) Select the joint of two or more sets from the oo-constrained, oe-constrained, eo-constrained, and ee-constrained sets to be a set $B$. Subtract the set $B$ from the set $A$ to form a set $C$. The set $C$ finally contains the codewords.

When the dominated error events are $\pm(1,-1)$, $k_1=2$.

Figure 4C:
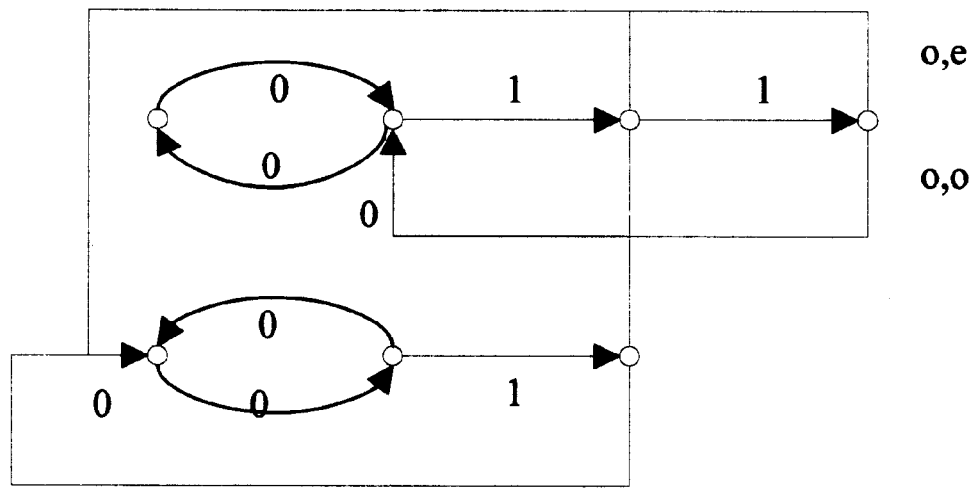
FIG. 4C is a state diagram of the NRZI($k_1$=2)-(ee+eo) constraints.

With reference to FIG. 4C, code patterns with the number of consecutive 1s being the maximum 2 are listed. The code patterns having '11' and with even numbers of 0s before and after '11' or with an even number of 0s before '11' and an odd number of 0s after '11' are removed. The channel capacity C is computed to be roughly 0.8232. There may exist a coding method that can exclude dominated error events $\pm(1,-1)$ and have a code rate of 4/5.

Figure 4D:
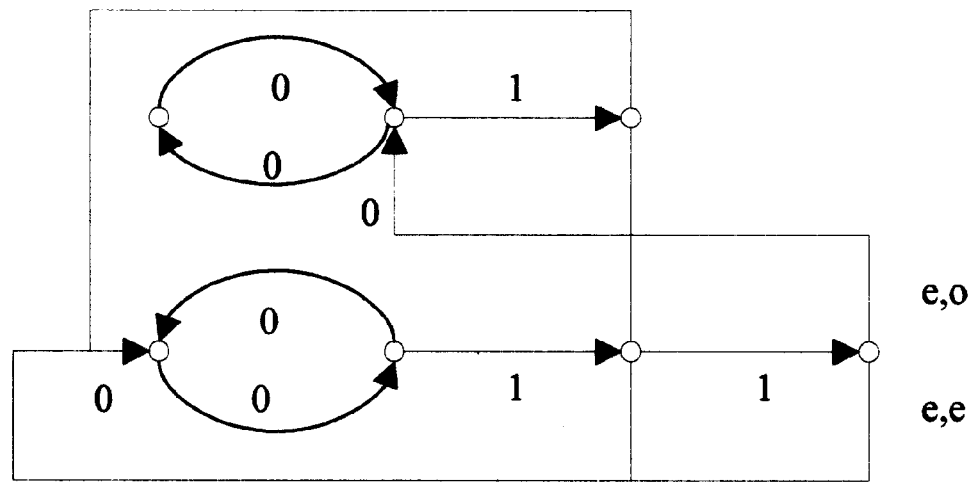
FIG. 4D is a state diagram of the NRZI($k_1$=2)-(oo+oe) constraints.

With reference to the state diagram in FIG. 4D, the channel capacity C is about 0.7745. It is thus impossible to find a coding method that can exclude dominated error events $\pm(1,-1)$ and have a code rate of 4/5.

Figure 4E:
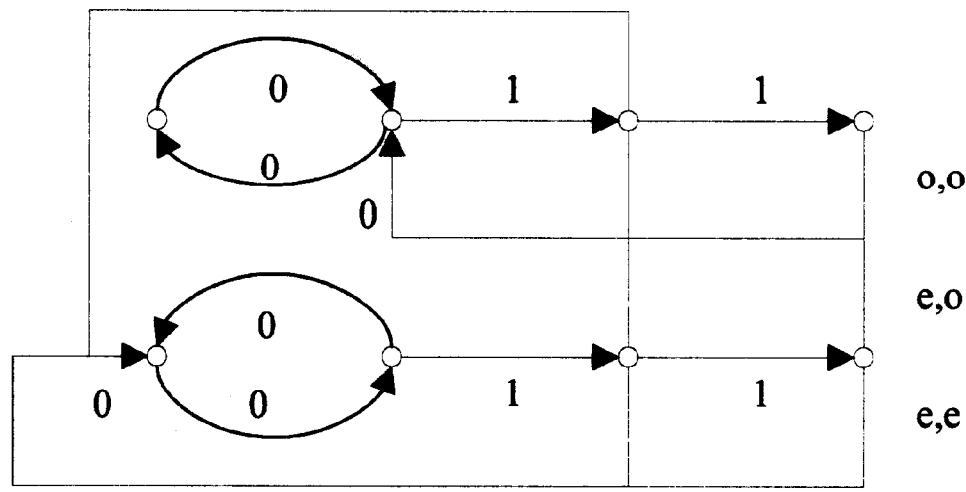
FIG. 4E is a state diagram of the NRZI($k_1$=2)-(oe) constraints.

With reference to the state diagram in FIG. 4E, the channel capacity C is computed to be roughly 0.8409. There may exist a coding method that can exclude dominated error events $\pm(1,-1)$ and have a code rate of 4/5. The code rate may even reach 5/6.

Figure 4F:
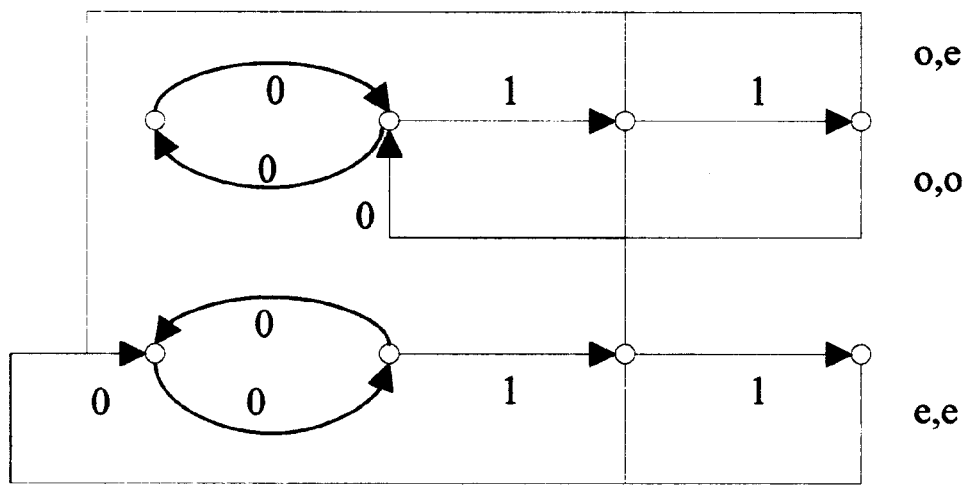
FIG. 4F is a state diagram of the NRZI($k_1$=2)-(eo) constraints.

With reference to the state diagram in FIG. 4F, the channel capacity C is the same as in FIG. 4E, roughly 0.8409. There may exist a coding method that can exclude dominated error events $\pm(1,-1$ and have a code rate of 4/5. The code rate may even reach 5/6.

In addition to the above-mentioned enumeration algorithm, the invention also provides an exhaustive method, which can be used to find the block code that prevents s types of dominated error events in the error event set $\Sigma=\{e_1, e_2, \ldots, e_s\}$ from happening. The method includes the following steps:

(step 1) Let $A_n$ be the set of sequences of length n and with the number of consecutive code symbol 1s less than $k_1$ and the number of consecutive code symbol 0s less than or equal to $k_0$, where $k_1$ is the maximum integer that will make the sequences in $A_n$ free from dominated error events.

(step 2) Let $B_n$ be the set of binary sequences of length n and with the number of the longest consecutive 1s in the sequences being $k_1$, the number of consecutive 0s being less than or equal to $k_0$, and satisfying the $\theta$, $\tau$, $\lambda$, and $\rho$ constrains, where $\theta$ is the maximum number of 1s before the first 0, $\theta$ is the maximum number of 1s after the last 0, $\tau$ is the maximum number of 0s before the first 1, and $\lambda$ is the maximum number of 0s after the last 1. Taking into account of the fact that one needs to exclude dominated error events even at the border of codeword connections, we choose $\theta=\lfloor k_1/2 \rfloor$, i.e., the maximum integer not greater than $k_1/2$, $\tau=k_1-\theta$.

(step 3) Select a subset $C_n$ of $B_n$ using the exhaustive method so that no dominated error events in $B_n$ can occur within any $C_n$. The number of codewords contained in $C_n$ is preferably as big as possible. The following sub-procedure gives an example to achieve this goal:

(3.0) Initially, let $C_n$ and $E_n$ be empty sets.

(3.1) Let $x_n$ be a code pattern in $B_n$ but not in the union of $C_n$ and $E_n$.

(3.2) Compute the error patterns of $x_n$ and each code pattern $y_n$ in $C_n$. If no error pattern is a dominated error event $\Sigma$, then $x_n$ is included into $C_n$; otherwise, let $E_n$ include $x_n$.

(3.3) If the union of $C_n$ and $E_n$ is equal to $B_n$, then stop this sub-procedure; otherwise, return to (3.1).

(step 4) Let $D_n$ be the union of $A_n$ and $C_n$. If the number of code patterns in $D_n$ is not less than $2^m$, then a code with a rate of m/n can be constructed by selecting $2^m$ code patterns from $D_n$.

When $\lambda+\rho \leq k_0$, the code found by using the above method can avoid the occurrence of s types of dominated error events and the number of consecutive 0s is less than or equal to $k_0$.

When $\Sigma=\{(1,-1),(-1,1)\}$, set $k_1=2$, $\theta=1$, $\tau=1$. Applying the above method to sequences of length n=10, there are 283 codewords found in $D_n$ and the parameter $k_0=18$.

FIG. 5A shows 283 codewords of length n=10 that can avoid the occurrence of the error events $\Sigma=\{(1,-1), (-1,1)\}$. One can select 256 codewords out of the 283 codewords to form a codebook. The 256 codewords can be chosen so that $k_0=9$.

FIG. 5B shows 257 codewords that can avoid the occurrence of the error events $\pm(1,-1)$ and the parameters $\rho=5$, $\lambda=4$. One can select 256 codewords fro them to form a coding method with a code rate of 8/10 and the parameter $k_0=9$.

As long as one can specifically define the error events to avoid, the above-mentioned methods can be applied to find a coding method for sequences with different lengths or parameters or even of different constraints. The methods are not limited to binary cases either.

EFFECTS OF THE INVENTION

The present invention provides two distance-enhancing coding methods. Taking a block length of 10 as an example, the code rate can be increased from 3/4 to 4/5, increasing by a ratio of 6.7% ((4/5-3/4)÷3/4×100). This code rate 4/5 is larger than the conventional ($k_{1,odd}=2$, $k_{1,even}=1$) TMTR constrained channel capacity 0.7925.

The invention provides two codebooks that can perform 8/10 coding. The block length of coding data is 8, which is particularly convenient for operations done in currently popular operating systems that process in unit of bytes (8 bits).

The invention provides two methods for searching block codes for distance-enhancing coding. The two methods can reach the code rate 4/5 when the block length is 10. The first method can have $k_0=11$ and the second method can have $k_0=9$.

The invention provides two methods for searching block codes for distance-enhancing coding. No matter how the parameters n, λ, ρ, $k_0$ vary, even when specific constraints vary, one can always use the disclosed methods to find proper block codes.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A distance-enhancing coding method for receiving input sequences and converting an m-bit received input sequence into a corresponding n-bit codeword following specific conversion rules, with m and n being positive integers and n>m, so that the codewords satisfy constraints characterized in that:

the constraints comprise a number of primary constraints and b number of exceptional constraints with a and b being positive integers, the primary constraint being a constraint on the number of consecutive code symbols with a same value and the exceptional constraint being a constraint on a segment of code sequences starting at a specific position satisfying an exceptional form, so that codewords satisfying either the primary constraints or the exeptional constraints are considered as satisfying the constraints;

wherein the primary constraint and the exceptional constraint comprise:

the number of consecutive 1s is not greater than $k_1$;

the number of consecutive 1s starting at an odd position is not greater than $k_{1,odd}$;

the number of consecutive 1s starting at an even position is not greater than $k_{1,even}$;

the number of consecutive 0s is not greater than $k_0$;

the number of 0s before the first 1 is not greater than λ; and the number of 0s after the last 1 is not greater than ρ; wherein $k_1$, $k_{1,odd}$, $k_{1,even}$, $k_0$, λ and ρ are integers;

further wherein the exceptional form of the exceptional constraint is to add to '10' consecutively k, 1s follows by '01' and the exceptional form starts at an even position if $k_{1,odd}>k_{1,even}$ while the exceptional form starts at an odd position if $k_{1,odd}<k_{1,even}$.

2. The method of claim 1, wherein $k_1$=2, $k_{1,odd}$=2, $k_{1,even}$=1 in the primary constraints and the exceptional constraint is that '101101' starts at an even position.

3. The method of claim 2, wherein m=8 and n=10.

4. The method of claim 3, wherein $k_0$=11, ρ=6, and λ=5.

5. The method of claim 2, wherein $k_0$=11 in the primary constraints.

6. The method of claim 5, wherein ρ=6 and λ=5 in the primary constraints.

7. The method of claim 2, wherein the codewords are the 256 codewords:

| | | | | | |
|---|---|---|---|---|---|
| 0000010000 | 0001101000 | 0100010001 | 0101101001 | 1000010010 | 1001101010 |
| 0000010001 | 0001101001 | 0100010010 | 0101101010 | 1000010100 | 1001101101 |
| 0000010010 | 0001101010 | 0100010100 | 0101101101 | 1000010101 | 1010000001 |
| 0000010100 | 0001101101 | 0100010101 | 0110000001 | 1000010110 | 1010000010 |
| 0000010101 | 0010000001 | 0100010110 | 0110000010 | 1000011000 | 1010000100 |
| 0000010110 | 0010000010 | 0100011000 | 0110000100 | 1000011001 | 1010000101 |
| 0000011000 | 0010000100 | 0100011001 | 0110000101 | 1000011010 | 1010000110 |
| 0000011001 | 0010000101 | 0100011010 | 0110000110 | 1000100000 | 1010001000 |
| 0000011010 | 0010000110 | 0100100000 | 0110001000 | 1000100001 | 1010001001 |
| 0000100000 | 0010001000 | 0100100001 | 0110001001 | 1000100010 | 1010001010 |
| 0000100001 | 0010001001 | 0100100010 | 0110001010 | 1000100100 | 1010010000 |
| 0000100010 | 0010001010 | 0100100100 | 0110010000 | 1000100101 | 1010010001 |
| 0000100100 | 0010010000 | 0100100101 | 0110010001 | 1000100110 | 1010010010 |
| 0000100101 | 0010010001 | 0100100110 | 0110010010 | 1000101000 | 1010010100 |
| 0000100110 | 0010010010 | 0100101000 | 0110010100 | 1000101001 | 1010010101 |
| 0000101000 | 0010010100 | 0100101001 | 0110010101 | 1000101010 | 1010010110 |
| 0000101001 | 0010010101 | 0100101010 | 0110010110 | 1000101101 | 1010011000 |
| 0000101010 | 0010010110 | 0100101101 | 0110011000 | 1001000000 | 1010011001 |
| 0000101101 | 0010011000 | 0101000000 | 0110011001 | 1001000001 | 1010011010 |
| 0001000000 | 0010011001 | 0101000001 | 0110011010 | 1001000010 | 1010100000 |
| 0001000001 | 0010011010 | 0101000010 | 0110100000 | 1001000100 | 1010100001 |
| 0001000010 | 0010100000 | 0101000100 | 0110100001 | 1001000101 | 1010100010 |
| 0001000100 | 0010100001 | 0101000101 | 0110100010 | 1001000110 | 1010100100 |
| 0001000101 | 0010100010 | 0101000110 | 0110100100 | 1001001000 | 1010100101 |
| 0001000110 | 0010100100 | 0101001000 | 0110100101 | 1001001001 | 1010100110 |
| 0001001000 | 0010100101 | 0101001001 | 0110100110 | 1001001010 | 1010101000 |
| 0001001001 | 0010100110 | 0101001010 | 0110101000 | 1001010000 | 1010101001 |
| 0001001010 | 0010101000 | 0101010000 | 0110101001 | 1001010001 | 1010101010 |
| 0001010000 | 0010101001 | 0101010001 | 0110101010 | 1001010010 | 1010101101 |
| 0001010001 | 0010101010 | 0101010010 | 0110101101 | 1001010100 | 1010110100 |
| 0001010010 | 0010101101 | 0101010100 | 0110110100 | 1001010101 | 1010110101 |
| 0001010100 | 0010110100 | 0101010101 | 0110110101 | 1001010110 | 1010110110 |
| 0001010101 | 0010110101 | 0101010110 | 0110110110 | 1001011000 | 1011010000 |
| 0001010110 | 0010110110 | 0101011000 | 1000000001 | 1001011001 | 1011010001 |
| 0001011000 | 0100000001 | 0101011001 | 1000000010 | 1001011010 | 1011010010 |
| 0001011001 | 0100000010 | 0101011010 | 1000000100 | 1001100000 | 1011010100 |
| 0001011010 | 0100000100 | 0101100000 | 1000000101 | 1001100001 | 1011010101 |
| 0001100000 | 0100000101 | 0101100001 | 1000000110 | 1001100010 | 1011010110 |
| 0001100001 | 0100000110 | 0101100010 | 1000001000 | 1001100100 | 1011011000 |
| 0001100010 | 0100001000 | 0101100100 | 1000001001 | 1001100101 | 1011011001 |
| 0001100100 | 0100001001 | 0101100101 | 1000001010 | 1001100110 | 1011011010 |

-continued

| | | | | |
|---|---|---|---|---|
| 0001100101 | 0100001010 | 0101100110 | 1000010000 | 1001101000 |
| 0001100110 | 0100010000 | 0101101000 | 1000010001 | 1001101001. |

8. The method of claim 2 wherein the codewords are transposes of the 256 codewords:

| | | | | | |
|---|---|---|---|---|---|
| 0000010000 | 0001101000 | 0100010001 | 0101101001 | 1000010010 | 1001101010 |
| 0000010001 | 0001101001 | 0100010010 | 0101101010 | 1000010100 | 1001101101 |
| 0000010010 | 0001101010 | 0100010100 | 0101101101 | 1000010101 | 1010000001 |
| 0000010100 | 0001101101 | 0100010101 | 0110000001 | 1000010110 | 1010000010 |
| 0000010101 | 0010000001 | 0100010110 | 0110000010 | 1000011000 | 1010000100 |
| 0000010110 | 0010000010 | 0100011000 | 0110000100 | 1000011001 | 1010000101 |
| 0000011000 | 0010000100 | 0100011001 | 0110000101 | 1000011010 | 1010000110 |
| 0000011001 | 0010000101 | 0100011010 | 0110000110 | 1000100000 | 1010001000 |
| 0000011010 | 0010000110 | 0100100000 | 0110001000 | 1000100001 | 1010001001 |
| 0000100000 | 0010001000 | 0100100001 | 0110001001 | 1000100010 | 1010001010 |
| 0000100001 | 0010001001 | 0100100010 | 0110001010 | 1000100100 | 1010010000 |
| 0000100010 | 0010001010 | 0100100100 | 0110010000 | 1000100101 | 1010010001 |
| 0000100100 | 0010010000 | 0100100101 | 0110010001 | 1000100110 | 1010010010 |
| 0000100101 | 0010010001 | 0100100110 | 0110010010 | 1000101000 | 1010010100 |
| 0000100110 | 0010010010 | 0100101000 | 0110010100 | 1000101001 | 1010010101 |
| 0000101000 | 0010010100 | 0100101001 | 0110010101 | 1000101010 | 1010010110 |
| 0000101001 | 0010010101 | 0100101010 | 0110010110 | 1000101101 | 1010011000 |
| 0000101010 | 0010010110 | 0100101101 | 0110011000 | 1001000000 | 1010011001 |
| 0000101101 | 0010011000 | 0101000000 | 0110011001 | 1001000001 | 1010011010 |
| 0001000000 | 0010011001 | 0101000001 | 0110011010 | 1001000010 | 1010100000 |
| 0001000001 | 0010011010 | 0101000010 | 0110100000 | 1001000100 | 1010100001 |
| 0001000010 | 0010100000 | 0101000100 | 0110100001 | 1001000101 | 1010100010 |
| 0001000100 | 0010100001 | 0101000101 | 0110100010 | 1001000110 | 1010100100 |
| 0001000101 | 0010100010 | 0101000110 | 0110100100 | 1001001000 | 1010100101 |
| 0001000110 | 0010100100 | 0101001000 | 0110100101 | 1001001001 | 1010100110 |
| 0001001000 | 0010100101 | 0101001001 | 0110100110 | 1001001010 | 1010101000 |
| 0001001001 | 0010100110 | 0101001010 | 0110101000 | 1001010000 | 1010101001 |
| 0001001010 | 0010101000 | 0101010000 | 0110101001 | 1001010001 | 1010101010 |
| 0001010000 | 0010101001 | 0101010001 | 0110101010 | 1001010010 | 1010101101 |
| 0001010001 | 0010101010 | 0101010010 | 0110101101 | 1001010100 | 1010110100 |
| 0001010010 | 0010101101 | 0101010100 | 0110110100 | 1001010101 | 1010110101 |
| 0001010100 | 0010110100 | 0101010101 | 0110110101 | 1001010110 | 1010110110 |
| 0001010101 | 0010110101 | 0101010110 | 0110110110 | 1001011000 | 1011010000 |
| 0001010110 | 0010110110 | 0101011000 | 1000000001 | 1001011001 | 1011010001 |
| 0001011000 | 0100000001 | 0101011001 | 1000000010 | 1001011010 | 1011010010 |
| 0001011001 | 0100000010 | 0101011010 | 1000000100 | 1001100000 | 1011010100 |
| 0001011010 | 0100000100 | 0101100000 | 1000000101 | 1001100001 | 1011010101 |
| 0001100000 | 0100000101 | 0101100001 | 1000000110 | 1001100010 | 1011010110 |
| 0001100001 | 0100000110 | 0101100010 | 1000001000 | 1001100100 | 1011011000 |
| 0001100010 | 0100001000 | 0101100100 | 1000001001 | 1001100101 | 1011011001 |
| 0001100100 | 0100001001 | 0101100101 | 1000001010 | 1001100110 | 1011011010 |
| 0001100101 | 0100001010 | 0101100110 | 1000010000 | 1001101000 | |
| 0001100110 | 0100010000 | 0101101000 | 1000010001 | 1001101001. | |

9. The method of claim 1, wherein $k_1=2$, $k_{1,odd}=1$, $k_{1,even}=2$ in the primary constraints and the exceptional constraint is that '101101' start at an odd position.

10. The method of claim 9, wherein m=8 and n=10.

11. The method of claim 9, wherein $k_0=11$ in the primary constraints.

12. The method of claim 11, wherein $\rho=6$, and $\lambda=5$ in the primary constraints.

13. The method of claim 1, wherein $k_1=2$, $k_{1,odd}=1$, $k_{1,even}=2$ in the primary constraints and the exceptional constraint is that '1011101' starts at an odd position.

14. The method of claim 1, wherein $k_1=3$, $k_{1,odd}=3$, $k_{1,even}=2$ in the primary constraints and the exceptional constraint is that '1011101' starts at an even position.

15. The method of claim 1, wherein $k_1=3$, $k_{1,odd}=3$, $k_{1,even}=2$ in the primary constraints and the exceptional constraint is that '1011101' starts at an odd position.

16. The method of claim 1, wherein the method for searching codewords comprises the steps of:

(step 1) specifying a block length of n and a code rate m/n for the code;

(step 2) setting $\rho$ to be an integer not greater than $k_0$, enumerating the binary sequences with a length of i and satisfying the ($k_{1,odd}=2$, $k_{1,even}=1$, $k_0$, $\lambda=\infty$, $\rho$) constraints, and denoting the number by $t_i$;

(step 3) setting $\lambda=k_0-\rho$ so that there will be $N_n-t_{n-\lambda-1}$ code patterns satisfying the ($k_{1,odd}=2$, $k_{1,even}=1$, $k_0$, $\lambda=k_0-\rho$, $\rho$) constraints. The sequences obtained by concatenating these $N_n-t_{n-\lambda-1}$ code patterns arbitrarily will satisfy the ($k_{1\ odd}=2$, $k_{1,even}=1$, $k_0$) constraints;

(step 4) enumerating the sequences which satisfy the exceptional constraints. The number will be $$B_n = \sum_{j=1}^{\lfloor \frac{n}{6} \rfloor} (X_{n,j} - Y_{n,j}),$$

-continued where L is the length of the exceptional constraint, $$X_{n,j} = \sum_{\substack{(i_1,i_2,i_3,i_j) \geq 0, \\ 2\sum_{l=1}^{j} i_l \leq n-jL}} \left[ (N_{n-jL-2\sum_{l=1}^{j} i_l} + 1) \prod_{l=1}^{J} (t_{2i_l} + 1) \right], \text{ and}$$

$$Y_{n,j} = \sum_{\substack{(i_1,i_2,i_3,i_j) \geq 0, \\ 2\sum_{l=1}^{j} i_l \leq n-jL-\lambda-1}} \left[ (N_{n-\lambda-1-jL-2\sum_{l=1}^{j} i_l} + 1) \prod_{l=1}^{J} (t_{2i_l} + 1) \right];$$

(step 5) $C_n = B_n + N_{n-t_{n-\lambda-1}}$ as the total number of binary sequences of length n and satisfying the ($k_{1,odd}$, $k_{1,even}$, $k_0$)+(exceptional constraint) constraints, where the exceptional constraint is described in claim 3. The sequences obtained by concatenating these $C_n$ code patterns arbitrarily will satisfy the ($k_{1,odd}=2$, $k_{1,even}=1$, $k_0$)+(exceptional constraint) constraints;

(step 6) adjusting n, $k_0$, and m and returning to step 1 if $C_n$ is less than $2^m$, and selecting $2^m$ codewords from the $C_n$ codewords to form a code with a code rate of m/n if $C_n$ is not less than $2^m$.

17. The method of claim 16, wherein the step 2 in the method for searching codewords performs enumeration according to the following definitions:

(D.0) two binary sequences of length n are said to be $X=(x_n, \ldots, x_2, x_1) \succ Y=(y_n, \ldots, y_2, y_1) \Leftrightarrow (x_p > y_p)$ and $(x_i = y_i) \forall p < i \leq n$:

The sequence Y is said to be ordered before the sequence X.

(D.1) An is the set of ($k_{1,odd}$, $k_{1,even}$, $k_0$, $\lambda=\infty$, $\rho$) constrained sequences of length n;

(D.2) R(X) is the number of sequences Y ∈An such that X $\succ$ Y;

(D.3) R(0)=0 where 0 is a binary sequence with n 0s;

(D.4) res(X) is the sequence obtained by modifying the first nonzero bit of X to be zero;

(D.5) $U_i$ is the minimum sequence among sequences in An and has the first nonzero symbol at position i;

(D.6) $M_i$ is the maximum sequence among sequences in An and has the first nonzero symbol at position i;

$$R(\underline{X}) = \sum_{i=0}^{n-1} x_i w_i;\quad \text{(D.7)}$$

(D.8) $t_i = R(M_i)$; and (D.9) $N_i = w_i + t_{i-2}$.

18. The method of claim 16, wherein the step 2 in the method for searching codewords sets ρ to be the largest integer that is not less than $k_0/2$.

19. The method of claim 16, wherein the step 6 in the method for searching codewords comprises the step of increasing n, $k_0$ and then returning the step 1 if $C_n < 2^m$.

20. The method of claim 16, wherein the step 6 in the method for searching codewords comprises the step of decreasing m and then returning the step 1 if $C_n < 2^m$.

21. The method of claim 16, wherein the step 6 in the method for searching codewords comprises the step of forming a code with a code rate of m/n by selecting $2^m$ codewords from the $C_n$ codewords, the selecting criteria is to minimize the parameter $k_0$ if $C_n$ is not less than $2^m$.

22. The method of claim 16, wherein the step 6 in the method for searching codewords comprises the step of forming a code with a code rate of m/n by selecting $2^m$ codewords from the $C_n$ codewords, the selecting criteria is to prevent the quasi-catastrophic error events to occur if $C_n$ is not less than $2^m$.

23. A distance-enhancing coding method for receiving input sequences and converting the input sequences according to specific conversion rules into codewords to prevent dominated error events from occurring, the codewords being obtained through the following steps:

(step 1) Let $A$ be the set of sequences with the number of consecutive code symbol 1s less than or equal to $k_1$ and the number of consecutive code code symbol 0s less than or equal to $k_0$, where $k_1$ is the minimum integer that will make sequences in $A$ have dominated error events;

(step 2) B is a set which consist of sequences in set A with the maximum number of consecutive 1s exactly $k_1$;

A sequence in set B is classified into the set Boo if the numbers of consecutive 0s before and after a segment of consecutive $k_1$ 1s are both odd;

A sequence in set B is classified into the set Bee if the numbers of consecutive 0s before and after a segment of consecutive $k_1$ 1s are both even;

A sequence in set B is classified into the set Boe if the numbers of consecutive 0s before and after a segment of consecutive $k_1$ 1s are odd and even, respectively;

A sequence in set B is classified into the set Beo if the numbers of consecutive 0s before and after a segment of consecutive $k_1$ 1s are even and odd, respectively;

Boo, Bee, Boe, and Beo are referred to as the oo-constrained set, ee-constrained set, oe-constrained set, and eo-constrained set, respectively.

(step 3) Select one or a number of plural of the sets Boo, Bee, Boe, and Beo. Set C is the union of the selected sets. Subtract the set C from the set $A$ to form a set D, i.e., D consists of sequences which is in A but not in C simultaneously. The set D contains the desired codewords.

24. The method of claim 23, wherein $k_1=2$ when the dominated error event set is $\Sigma=\{e_1=(1,-1), e_2=(-1,1)\}$.

25. The method of claim 24, wherein the step 3 selects the sets Boo and Boe to form set C.

26. The method of claim 24, wherein the step 3 selects the set Boe to form set C.

27. The method of claim 24, wherein the step 3 selects the set Beo to form set C.

28. The method of claim 23, wherein $k_1=3$ when the dominated error event set is $\Sigma=\{e_1=(1,-1,1), e_2=(-1,1,-1)\}$.

29. The method of claim 28, wherein the step 3 selects the sets Bee and Beo to form set C.

30. The method of claim 28, wherein the step 3 selects the sets Boo and Boe to form set C.

31. The method of claim 28, wherein the step 3 selects the set Boe to form set C.

32. The method of claim 28, wherein the step 3 selects the set Beo to form set C.

33. A distance-enhancing coding method, which can avoid the occurrence of s types of dominated error events in the error event set $\Sigma=\{e_1, e_2, \ldots, e_s\}$ and require the number of continuous 0s not greater than $k_0$ in the coded result for receiving input sequences and converting an m-bit received input sequences into a corresponding n-bit codeword following specific conversion rules, with m and n being positive integers, the method for searching the codewords comprises the following steps:

(step 1) Let $A_n$ be the set of sequences of length n and with the number of consecutive code symbol 1s less than $k_1$ and the number of consecutive code symbol 0s less than or equal to $k_0$, where $k_1$ is the maximum integer that will make the sequences in $A_n$ free from dominated error events;

(step 2) Let $B_n$ be the set of binary sequences of length n and with the number of the longest consecutive 1s in the sequences being $k_1$, the number of consecutive 0s being less than or equal to $k_0$, and satisfying the $\theta, \tau, \lambda$ and $\rho$ constraints, where $\theta$ is the maximum number of 1s before the first 0, $\tau$ is the maximum number of 1s after the last 0, $\lambda$ is the maximum number of 0s before the first 1, and $\rho$ is the maximum number of 0s after the last 1. Taking into account of the fact that one needs to exclude dominated error events even at the border of codeword connections, we choose $\theta = \lfloor k_1/2 \rfloor$, i.e., the maximum integer not greater than $k_1/2, \tau = k_1 - \theta$;

(step 3) Select a subset $C_n$ of $B_n$ using the exhaustive method so that no dominated error events in $\Sigma$ can occur within any $C_n$. The number of codewords contained in $C_n$ is preferably as big as possible. The following sub-procedure gives the way to achieve this goal:

(3.0) Initially, let $C_n$ and $E_n$ be equal to the empty set;

(3.1) Let $x_n$ be a code pattern in $B_n$ but not in the union of $C_n$ and $E_n$;

(3.2) Compute the error patterns of $x_n$ and each code pattern $y_n$ in $C_n$. If no error pattern is a dominated error event □, then $x_n$ is included into $C_n$; otherwise, let $E_n$ include $x_n$;

(3.3) If the union of $C_n$ and $E_n$ is equal to $B_n$, then stop this sub-procedure; otherwise, return to (3.1);

(step 4) Let $D_n$ be the union of $A_n$ and $C_n$. If the number of code patterns in $D_n$ is not less than $2^m$, then a code with a rate of m/n can be constructed by selecting $2^m$ code patterns from $D_n$.

34. The method of claim 33, wherein the dominated error event set $\Sigma = \{e_1 = (1,-1), e_2(-1,1)\}$, $k_1 = 2$, $\theta = 1$, $\tau = 1$.

35. The method of claim 34, wherein m=8 and n=10.

36. The method of claim 34, wherein $k_0 = 9$.

37. The method of claim 34, wherein $\lambda + \rho$ is not greater than $k_0$.

38. The method of claim 37, wherein $\lambda = 4$ and $\rho = 5$.

39. The method of claim 38, wherein m=8, n=10, and $k_0 = 9$.

40. The method of claim 37, wherein $\lambda$=b 5and $\rho$=4.

41. The method of claim 34, wherein the codewords are any 256 codewords selected from the 257 codewords:

| | | | | | |
|---|---|---|---|---|---|
| 0000100000 | 0100000101 | 1000100010 | 0000110100 | 0100100110 | 1000101101 |
| 0000100001 | 0100001000 | 1000100100 | 0000110101 | 0100101101 | 1000110000 |
| 0000100010 | 0100001001 | 1000100101 | 0000110110 | 0100110001 | 1000110001 |
| 0000100100 | 0100001010 | 1000101000 | 0001000101 | 0100110100 | 1000110010 |
| 0000100101 | 0100010000 | 1000101001 | 0001001101 | 0100110101 | 1000110100 |
| 0000101000 | 0100010001 | 1000101010 | 0001010110 | 0100110110 | 1000110101 |
| 0000101001 | 0100010010 | 1001000001 | 0001011000 | 0101000110 | 1000110110 |
| 0000101010 | 0100010100 | 1001000010 | 0001011010 | 0101001101 | 1001000110 |
| 0001000001 | 0100010101 | 1001000100 | 0001101000 | 0101010110 | 1001001101 |
| 0001000010 | 0100100000 | 1001000101 | 0001101001 | 0101011000 | 1001010110 |
| 0001000100 | 0100100001 | 1001001000 | 0001101010 | 0101011010 | 1001011000 |
| 0001000101 | 0100100010 | 1001001100 | 0001101100 | 0101100000 | 1001011010 |
| 0001001000 | 0100100100 | 1001001010 | 0001101101 | 0101100010 | 1001101000 |
| 0001001001 | 0100100101 | 1001010000 | 0010000110 | 0101101000 | 1001101001 |
| 0001001010 | 0100101000 | 1001010001 | 0010001101 | 0101101001 | 1001101010 |
| 0001010000 | 0100101001 | 1001010010 | 0010010110 | 0101101010 | 1001101100 |
| 0001010001 | 0100101010 | 1001010100 | 0010011000 | 0101101100 | 1001101101 |
| 0001010010 | 0101000001 | 1001010101 | 0010011010 | 0101101101 | 1010000110 |
| 0001010100 | 0101000010 | 1010000001 | 0010100110 | 0110001000 | 1010001101 |
| 0001010101 | 0101000100 | 1010000010 | 0010101101 | 0110001001 | 1010010110 |
| 0010000001 | 0101000101 | 1010000100 | 0010110001 | 0110001010 | 1010011000 |
| 0010000010 | 0101001000 | 1010000101 | 0010110100 | 0110001100 | 1010011010 |
| 0010000100 | 0101001001 | 1010001000 | 0010110101 | 0110001101 | 1010100110 |
| 0010000101 | 0101001010 | 1010001001 | 0010110110 | 0110100000 | 1010101101 |
| 0010001000 | 0101010000 | 1010001010 | 0011000001 | 0110100001 | 1010110001 |
| 0010001001 | 0101010001 | 1010010000 | 0011000010 | 0110100010 | 1010110100 |
| 0010001010 | 0101010010 | 1010010001 | 0011000100 | 0110100100 | 1010110101 |
| 0010010000 | 0101010100 | 1010010010 | 0011000101 | 0110100101 | 1010110110 |
| 0010010001 | 0101010101 | 1010010100 | 0011000110 | 0110100110 | 1011000001 |
| 0010010010 | 1000000001 | 1010010101 | 0011010000 | 0110101000 | 1011000010 |
| 0010010100 | 1000000010 | 1010100000 | 0011010001 | 0110101001 | 1011000100 |
| 0010010101 | 1000000100 | 1010100001 | 0011010010 | 0110101010 | 1011000101 |
| 0010100000 | 1000000101 | 1010100010 | 0011010100 | 0110101101 | 1011000110 |
| 0010100001 | 1000001000 | 1010100100 | 0011010101 | 0110110000 | 1011010000 |
| 0010100010 | 1000001001 | 1010100101 | 0011010110 | 0110110001 | 1011010001 |
| 0010100100 | 1000001010 | 1010101000 | 0011011000 | 0110110010 | 1011010010 |
| 0010100101 | 1000010000 | 1010101001 | 0011011001 | 0110110100 | 1011010100 |
| 0010101000 | 1000010001 | 1010101010 | 0011011010 | 0110110101 | 1011010101 |
| 0010101001 | 1000010010 | 0000100110 | 0100000110 | 0110110110 | 1011010110 |
| 0010101010 | 1000010100 | 0000101101 | 0100001101 | 1000000110 | 1011011000 |
| 0100000001 | 1000010101 | 0000110000 | 0100010110 | 1000001101 | 1011011001 |
| 0100000010 | 1000100000 | 0000110001 | 0100011000 | 1000010110 | 1011011010 |
| 0100000100 | 1000100001 | 0000110010 | 0100011010 | 1000100110. | |

42. The method of claim 34, wherein the codewords are the transposes of any 256 codewords selected from the 257 codewords:

| | | | | | |
|---|---|---|---|---|---|
| 0000100000 | 0100000101 | 1000100010 | 0000110100 | 0100100110 | 1000101101 |
| 0000100001 | 0100001000 | 1000100100 | 0000110101 | 0100101101 | 1000110000 |
| 0000100010 | 0100001001 | 1000100101 | 0000110110 | 0100110001 | 1000110001 |
| 0000100100 | 0100001010 | 1000101000 | 0001000110 | 0100110100 | 1000110010 |
| 0000100101 | 0100010000 | 1000101001 | 0001001101 | 0100110101 | 1000110100 |
| 0000101000 | 0100010001 | 1000101010 | 0001010110 | 0100110110 | 1000110101 |
| 0000101001 | 0100010010 | 1001000001 | 0001011000 | 0101000110 | 1000110110 |
| 0000101010 | 0100010100 | 1001000010 | 0001011010 | 0101001101 | 1001000110 |
| 0001000001 | 0100010101 | 1001000100 | 0001101000 | 0101010110 | 1001001101 |
| 0001000010 | 0100100000 | 1001000101 | 0001101001 | 0101011000 | 1001010110 |
| 0001000100 | 0100100001 | 1001001000 | 0001101010 | 0101011010 | 1001011000 |
| 0001000101 | 0100100010 | 1001001001 | 0001101100 | 0101100000 | 1001011010 |
| 0001001000 | 0100100100 | 1001001010 | 0001101101 | 0101100010 | 1001101000 |
| 0001001001 | 0100100101 | 1001010000 | 0010000110 | 0101101000 | 1001101001 |
| 0001001010 | 0100101000 | 1001010001 | 0010001101 | 0101101001 | 1001101010 |
| 0001010000 | 0100101001 | 1001010010 | 0010010110 | 0101101010 | 1001101100 |
| 0001010001 | 0100101010 | 1001010100 | 0010011000 | 0101101100 | 1001101101 |
| 0001010010 | 0101000001 | 1001010101 | 0010011010 | 0101101101 | 1010000110 |
| 0001010100 | 0101000010 | 1010000001 | 0010100110 | 0110001000 | 1010001101 |
| 0001010101 | 0101000100 | 1010000010 | 0010101101 | 0110001001 | 1010010110 |
| 0010000001 | 0101000101 | 1010000100 | 0010110001 | 0110001010 | 1010011000 |
| 0010000010 | 0101001000 | 1010000101 | 0010110100 | 0110001100 | 1010011010 |
| 0010000100 | 0101001001 | 1010001000 | 0010110101 | 0110001101 | 1010100110 |
| 0010000101 | 0101001010 | 1010001001 | 0010110110 | 0110100000 | 1010101101 |
| 0010001000 | 0101010000 | 1010001010 | 0011000001 | 0110100001 | 1010110001 |
| 0010001001 | 0101010001 | 1010010000 | 0011000010 | 0110100010 | 1010110100 |
| 0010001010 | 0101010010 | 1010010001 | 0011000100 | 0110100100 | 1010110101 |
| 0010010000 | 0101010100 | 1010010010 | 0011000101 | 0110100101 | 1010110110 |
| 0010010001 | 0101010101 | 1010010100 | 0011001000 | 0110100110 | 1011000001 |
| 0010010010 | 1000000001 | 1010010101 | 0011010000 | 0110101000 | 1011000010 |
| 0010010100 | 1000000010 | 1010100000 | 0011010001 | 0110101001 | 1011000100 |
| 0010010101 | 1000000100 | 1010100001 | 0011010010 | 0110101010 | 1011000101 |
| 0010100000 | 1000000101 | 1010100010 | 0011010100 | 0110101101 | 1011001000 |
| 0010100001 | 1000001000 | 1010100100 | 0011010101 | 0110110000 | 1011010000 |
| 0010100010 | 1000001001 | 1010100101 | 0011010110 | 0110110001 | 1011010001 |
| 0010100100 | 1000001010 | 1010101000 | 0011011000 | 0110110010 | 1011010010 |
| 0010100101 | 1000010000 | 1010101001 | 0011011001 | 0110110100 | 1011010100 |
| 0010101000 | 1000010001 | 1010101010 | 0011011010 | 0110110101 | 1011010101 |
| 0010101001 | 1000010010 | 0000100110 | 0100000110 | 0110110110 | 1011010110 |
| 0010101010 | 1000010100 | 0000101101 | 0100001101 | 1000000110 | 1011011000 |
| 0100000001 | 1000010101 | 0000110000 | 0100010110 | 1000001101 | 1011011001 |
| 0100000010 | 1000100000 | 0000110001 | 0100011000 | 1000010110 | 1011011010 |
| 0100000100 | 1000100001 | 0000110010 | 0100011010 | 1000100110. | |

43. The method of claim 34, wherein the codewords are any 256 codewords selected from the 283 codewords:

| | | | | | |
|---|---|---|---|---|---|
| 0000000001 | 0010100001 | 1000001001 | 1010101001 | 0011011001 | 0110110110 |
| 0000000010 | 0010100010 | 1000001010 | 1010101010 | 0011011010 | 1000000110 |
| 0000000100 | 0010100100 | 1000010000 | 0000000110 | 0100000110 | 1000001101 |
| 0000000101 | 0010100101 | 1000010001 | 0000001101 | 0100001101 | 1000010110 |
| 0000001000 | 0010101000 | 1000010010 | 0000010110 | 0100010110 | 1000011000 |
| 0000001001 | 0010101001 | 1000010100 | 0000011000 | 0100011000 | 1000011010 |
| 0000001010 | 0010101010 | 1000010101 | 0000011010 | 0100011010 | 1000100110 |
| 0000010000 | 0100000000 | 1000100000 | 0000100110 | 0100100110 | 1000101101 |
| 0000010001 | 0100000001 | 1000100001 | 0000101101 | 0100101101 | 1000110001 |
| 0000010010 | 0100000010 | 1000100010 | 0000110001 | 0100110001 | 1000110100 |
| 0000010100 | 0100000100 | 1000100100 | 0000110100 | 0100110100 | 1000110101 |
| 0000010101 | 0100000101 | 1000100101 | 0000110101 | 0100110101 | 1000110110 |
| 0000100000 | 0100001000 | 1000101000 | 0000110110 | 0100110110 | 1001000110 |
| 0000100001 | 0100001001 | 1000101001 | 0001000110 | 0101000110 | 1001001101 |
| 0000100010 | 0100001010 | 1000101010 | 0001001101 | 0101001101 | 1001010110 |
| 0000100100 | 0100010000 | 1001000000 | 0001010110 | 0101010110 | 1001011000 |
| 0000100101 | 0100010001 | 1001000001 | 0001011000 | 0101011000 | 1001011010 |
| 0000101000 | 0100010010 | 1001000010 | 0001011010 | 0101011010 | 1001100000 |
| 0000101001 | 0100010100 | 1001000100 | 0001100000 | 0101100000 | 1001100010 |
| 0000101010 | 0100010101 | 1001000101 | 0001100010 | 0101100010 | 1001101000 |
| 0001000000 | 0100100000 | 1001001000 | 0001101000 | 0101101000 | 1001101001 |
| 0001000001 | 0100100001 | 1001001001 | 0001101001 | 0101101001 | 1001101010 |
| 0001000010 | 0100100010 | 1001001010 | 0001101010 | 0101101010 | 1001101100 |

-continued

| | | | | | |
|---|---|---|---|---|---|
| 0001000100 | 0100100100 | 1001010000 | 0001101100 | 0101101100 | 1001101101 |
| 0001000101 | 0100100101 | 1001010001 | 0001101101 | 0101101101 | 1010000110 |
| 0001001000 | 0100101000 | 1001010010 | 0010000110 | 0110000000 | 1010001101 |
| 0001001001 | 0100101001 | 1001010100 | 0010001101 | 0110000010 | 1010010110 |
| 0001001010 | 0100101010 | 1001010101 | 0010010110 | 0110001000 | 1010011000 |
| 0001010000 | 0101000000 | 1010000000 | 0010011000 | 0110001001 | 1010011010 |
| 0001010001 | 0101000001 | 1010000001 | 0010011010 | 0110001010 | 1010100110 |
| 0001010010 | 0101000010 | 1010000010 | 0010100110 | 0110001100 | 1010101101 |
| 0001010100 | 0101000100 | 1010000100 | 0010101101 | 0110001101 | 1010110001 |
| 0001010101 | 0101000101 | 1010000101 | 0010110001 | 0110100000 | 1010110100 |
| 0010000000 | 0101001000 | 1010001000 | 0010110100 | 0110100001 | 1010110101 |
| 0010000001 | 0101001001 | 1010001001 | 0010110101 | 0110100010 | 1010110110 |
| 0010000010 | 0101001010 | 1010001010 | 0010110110 | 0110100100 | 1011000001 |
| 0010000100 | 0101010000 | 1010010000 | 0011000001 | 0110100101 | 1011000100 |
| 0010000101 | 0101010001 | 1010010001 | 0011000100 | 0110100110 | 1011000101 |
| 0010001000 | 0101010010 | 1010010010 | 0011000101 | 0110101000 | 1011000110 |
| 0010001001 | 0101010100 | 1010010100 | 0011000110 | 0110101001 | 1011010000 |
| 0010001010 | 0101010101 | 1010010101 | 0011010000 | 0110101010 | 1011010001 |
| 0010010000 | 1000000000 | 1010100000 | 0011010001 | 0110101101 | 1011010010 |
| 0010010001 | 1000000001 | 1010100001 | 0011010010 | 0110110000 | 1011010100 |
| 0010010010 | 1000000010 | 1010100010 | 0011010100 | 0110110001 | 1011010101 |
| 0010010100 | 1000000100 | 1010100100 | 0011010101 | 0110110010 | 1011010110 |
| 0010010101 | 1000000101 | 1010100101 | 0011010110 | 0110110100 | 1011011000 |
| 0010100000 | 1000001000 | 1010101000 | 0011011000 | 0110110101 | 1011011001 |
| | | | | | 1011011010. |

44. The method of claim 34, wherein the codewords are the transposes of any 256 codewords selected from the 283 codewords:

| | | | | | |
|---|---|---|---|---|---|
| 0000000001 | 0010100001 | 1000001001 | 1010101001 | 0011011001 | 0110110110 |
| 0000000010 | 0010100010 | 1000001010 | 1010101010 | 0011011010 | 1000000110 |
| 0000000100 | 0010100100 | 1000010000 | 0000000110 | 0100000110 | 1000001101 |
| 0000000101 | 0010100101 | 1000010001 | 0000001101 | 0100001101 | 1000010110 |
| 0000001000 | 0010101000 | 1000010010 | 0000010110 | 0100010110 | 1000011000 |
| 0000001001 | 0010101001 | 1000010100 | 0000011000 | 0100011000 | 1000011010 |
| 0000001010 | 0010101010 | 1000010101 | 0000011010 | 0100011010 | 1000100110 |
| 0000010000 | 0100000000 | 1000100000 | 0000100110 | 0100100110 | 1000101101 |
| 0000010001 | 0100000001 | 1000100001 | 0000101101 | 0100101101 | 1000110001 |
| 0000010010 | 0100000010 | 1000100010 | 0000110001 | 0100110001 | 1000110100 |
| 0000010100 | 0100000100 | 1000100100 | 0000110100 | 0100110100 | 1000110101 |
| 0000010101 | 0100000101 | 1000100101 | 0000110101 | 0100110101 | 1000110110 |
| 0000100000 | 0100001000 | 1000101000 | 0000110110 | 0100110110 | 1001000110 |
| 0000100001 | 0100001001 | 1000101001 | 0001000110 | 0101000110 | 1001001101 |
| 0000100010 | 0100001010 | 1000101010 | 0001001101 | 0101001101 | 1001010110 |
| 0000100100 | 0100010000 | 1001000000 | 0001010110 | 0101010110 | 1001011000 |
| 0000100101 | 0100010001 | 1001000001 | 0001011000 | 0101011000 | 1001011010 |
| 0000101000 | 0100010010 | 1001000010 | 0001011010 | 0101011010 | 1001100000 |
| 0000101001 | 0100010100 | 1001000100 | 0001100000 | 0101100000 | 1001100010 |
| 0000101010 | 0100010101 | 1001000101 | 0001100010 | 0101100010 | 1001101000 |
| 0001000000 | 0100100000 | 1001001000 | 0001101000 | 0101101000 | 1001101001 |
| 0001000001 | 0100100001 | 1001001001 | 0001101001 | 0101101001 | 1001101010 |
| 0001000010 | 0100100010 | 1001001010 | 0001101010 | 0101101010 | 1001101100 |
| 0001000100 | 0100100100 | 1001010000 | 0001101100 | 0101101100 | 1001101101 |
| 0001000101 | 0100100101 | 1001010001 | 0001101101 | 0101101101 | 1010000110 |
| 0001001000 | 0100101000 | 1001010010 | 0010000110 | 0110000000 | 1010001101 |
| 0001001001 | 0100101001 | 1001010100 | 0010001101 | 0110000010 | 1010010110 |
| 0001001010 | 0100101010 | 1001010101 | 0010010110 | 0110001000 | 1010011000 |
| 0001010000 | 0101000000 | 1010000000 | 0010011000 | 0110001001 | 1010011010 |
| 0001010001 | 0101000001 | 1010000001 | 0010011010 | 0110001010 | 1010100110 |
| 0001010010 | 0101000010 | 1010000010 | 0010100110 | 0110001100 | 1010101101 |
| 0001010100 | 0101000100 | 1010000100 | 0010101101 | 0110001101 | 1010110001 |
| 0001010101 | 0101000101 | 1010000101 | 0010110001 | 0110100000 | 1010110100 |
| 0010000000 | 0101001000 | 1010001000 | 0010110100 | 0110100001 | 1010110101 |
| 0010000001 | 0101001001 | 1010001001 | 0010110101 | 0110100010 | 1010110110 |
| 0010000010 | 0101001010 | 1010001010 | 0010110110 | 0110100100 | 1011000001 |
| 0010000100 | 0101010000 | 1010010000 | 0011000001 | 0110100101 | 1011000100 |
| 0010000101 | 0101010001 | 1010010001 | 0011000100 | 0110100110 | 1011000101 |
| 0010001000 | 0101010010 | 1010010010 | 0011000101 | 0110101000 | 1011000110 |
| 0010001001 | 0101010100 | 1010010100 | 0011000110 | 0110101001 | 1011010000 |
| 0010001010 | 0101010101 | 1010010101 | 0011010000 | 0110101010 | 1011010001 |
| 0010010000 | 1000000000 | 1010100000 | 0011010001 | 0110101101 | 1011010010 |
| 0010010001 | 1000000001 | 1010100001 | 0011010010 | 0110110000 | 1011010100 |
| 0010010010 | 1000000010 | 1010100010 | 0011010100 | 0110110001 | 1011010101 |

-continued

| | | | | | |
|---|---|---|---|---|---|
| 0010010100 | 1000000100 | 1010100100 | 0011010101 | 0110110010 | 1011010110 |
| 0010010101 | 1000000101 | 1010100101 | 0011010110 | 0110110100 | 1011011000 |
| 0010100000 | 1000001000 | 1010101000 | 0011011000 | 0110110101 | 1011011001 |
| | | | | | 1011011010. |

45. The method of claim 33, wherein the dominated error event set $\Sigma=\{e_1=(1,-1,1), e_2=(-1,1,1)\}$, $k_1=3$, $\theta=1$, $\tau=2$.

46. The method of claim 45, wherein $2^m$ codewords selected from the founded codewords are made into a codebook.

47. The method of claim 45, wherein the transposes of $2^m$ codewords selected from the codewords are made into a codebook.

* * * * *